US 8,004,012 B2

(12) United States Patent
Klipstein

(10) Patent No.: US 8,004,012 B2
(45) Date of Patent: Aug. 23, 2011

(54) UNIPOLAR SEMICONDUCTOR PHOTODETECTOR WITH SUPPRESSED DARK CURRENT AND METHOD FOR PRODUCING THE SAME

(75) Inventor: Philip Klipstein, Zikhron Ya'akov (IL)

(73) Assignee: Semi-Conductor Devices—An Elbit Systems-Rafael Partnership, Haifa (IL)

( * ) Notice: Subject to any disclaimer, the term of this patent is extended or adjusted under 35 U.S.C. 154(b) by 242 days.

(21) Appl. No.: 12/295,228

(22) PCT Filed: Mar. 29, 2007

(86) PCT No.: PCT/IL2007/000423
§ 371 (c)(1),
(2), (4) Date: Oct. 2, 2008

(87) PCT Pub. No.: WO2007/113821
PCT Pub. Date: Oct. 11, 2007

(65) Prior Publication Data
US 2009/0256231 A1    Oct. 15, 2009

(30) Foreign Application Priority Data
Apr. 6, 2006    (IL) .......................................... 174844

(51) Int. Cl.
*H01L 21/02*    (2006.01)
*H01L 31/00*    (2006.01)
(52) U.S. Cl. ................. 257/196; 257/E31.061
(58) Field of Classification Search .................. 257/441, 257/443, E27.13, E31.003, 183, 196, E31.061, 257/E33.05
See application file for complete search history.

(56) References Cited

U.S. PATENT DOCUMENTS
4,679,063 A    7/1987    White
(Continued)

FOREIGN PATENT DOCUMENTS
WO    WO-02/084740    10/2002
(Continued)

OTHER PUBLICATIONS

Sze, Semiconductor Devices. Physics and Technology, 2002, John Wiley & Sons, pp. 37-38, Fig. 24.*
(Continued)

*Primary Examiner* — Thomas L Dickey
*Assistant Examiner* — Nikolay Yushin
(74) *Attorney, Agent, or Firm* — Morrison & Foerster LLP

(57) ABSTRACT

A photo-detector with a reduced G-R noise comprises two n-type narrow bandgap layers surrounding a middle barrier layer having an energy bandgap at least equal to the sum of the bandgaps of the two narrow bandgap layers. Under the flat band conditions the conduction band edge of each narrow bandgap layer lies below the conduction band edge of the barrier layer by at least the bandgap energy of the other narrow bandgap layer. When biased with an externally applied voltage, the more negatively biased narrow bandgap layer is the contact layer and the more positively biased narrow bandgap layer is the photon absorbing layer. Under external bias conditions the bands in the photon absorbing layer next to the barrier layer are flat or accumulated, and the flat part of the valence band edge in the photon absorbing layer lies below the flat part of the valence band edge of the contact layer and has an energy of not more than 10kTop above the valence band edge in any part of the barrier layer (k=Boltzman constant and Top=operating temperature).

35 Claims, 20 Drawing Sheets

U.S. PATENT DOCUMENTS

| | | | |
|---|---|---|---|
| 4,740,819 | A | 4/1988 | Ouchi et al. |
| 6,117,702 | A | 9/2000 | Nakamura et al. |
| 6,740,908 | B1 * | 5/2004 | Giboney ............ 257/185 |
| 2002/0027238 | A1 | 3/2002 | Lin et al. |
| 2007/0034898 | A1 | 2/2007 | Tennant et al. |

FOREIGN PATENT DOCUMENTS

| | | | |
|---|---|---|---|
| WO | WO2005/004243 | * | 1/2005 |
| WO | WO-2005004232 | | 1/2005 |

OTHER PUBLICATIONS www.igitur-archive.library.uu.nl/dissertations/2002-0806-101243/c1.pdf pp. 9-14.*

Maimon S, et al: "nBn detector, an infrared detector with reduced dark current and higher operating temperature" Applied Physics Letters, AIP, American Institute of Physics, Melville, NY, vol. 89, No. 15, Oct. 10, 2006, pp. 151109-151109.

PCT/ISA/210—International Search Report—Nov. 23, 2007.

PCT/IPEA/409—International Preliminary Report on Patentability—Jul. 25, 2008.

Park, J. et al., Reduction of Dark Current in an N-type In0.3Ga0.7As/Ga/As quantum well infrared photodetector by using a camel diode structure, Solid State Electronics, Elsevier Science Publishers, vol. 46, No. 5, May 2002, pp. 651-654.

Watanabe et al., Extremely Low Dark Current InAlAs/InGaAlAs Quaternary Well Superlattice APD, Proceedings of the International Conference on Indium Phosphide and Related Materials, vol. Conf.4, Apr. 21, 1992, pp. 246-249.

Maimon, S. et al., "InAsSb/GaAlSb/InAsSb nBn IR detector for the 3-5 um," the 11th International Conference on Narrow Gap Semiconductors (NGS-11), held at the University at Buffalo, New York, U.S.A., Jun. 16-20, 2003, source: abstract included in the booklet of Program and Abstracts of the said Conference.

J.L. Johnson et al., "Electrical and optical properties of infrared photodiodes using the $InAs/Ga_{1-x}In_xSb$ superlattice in heterojunctions with GaSB," *J. Appl. Phys.*, vol. 80(2), pp. 1116-1127 Jul. 15, 1996.

C.T. Elliott, "Advanced heterostructures for $In_{1-x}Al_xSb$ and $Hg_{1-x}Cd_xTe$ detectors and emitters," *SPIE*, vol. 2744, *Infrared Technology and Applications XXII*, pp. 452-462 (Jun. 1996).

A. Rakovska et al., "Room temperature in AsSb photovoltaic midinfrared detector," *Applied Physics Letters*, vol. 77, No. 3, pp. 397-401 (Jul. 17, 2000).

S. Maimon et al., "nBn detector, an infrared detector with reduced dark current and higher operating temperature," *Applied Physics Letters*, vol. 89, pp. 151109-1-151109-3 (2006).

Shyh Wang, "Fundamentals of Semiconductor Theory and Device Physics," *Simple Semiconductor Junction Devices*, Chap. 8, Title page, pp. 377-378.

J. Bajaj, "State-of-the-art HgCdTe Infrared Devices," *SPIE Proceedings*, vol., pp. 42-54 (2000).

Tim Ashley et al., "Large Format MWIR Focal Plane Arrays," *SPIE Proceedings*, vol. 4820, pp. 400-405 (2003).

R.A. Stradling et al., Imperial College of Science, Technology and Medicine, University of London, *Growth and Characterisation of Semiconductors*, IOF Publishing Ltd., 1990 (Table of Contents only).

I. Vurgaftman et al., "Band parameters for III-V compound semiconductors and their alloys," *Journal of Applied Physics*, vol. 89, No. 11, pp. 5815-5875 (Jun. 1, 2001).

P.C. Klipstein et al., "Controlled Growth of Interfaces in InAs/GaSb Heterostructures: Their Structural, Vibrational and Electronic Properties" in *Semiconductor Hetero-Epitaxy*, published by World Scientific, Singapore, pp. 515-523.

Philip Klipstein et al., "Antimonide Based Material for Infrared Detection," *SPIE Proceedings*, vol. 4820, pp. 654-662.

* cited by examiner

UNIPOLAR SEMICONDUCTOR PHOTODETECTOR WITH SUPPRESSED DARK CURRENT AND METHOD FOR PRODUCING THE SAME

FIELD OF THE INVENTION

The present invention relates to photodiodes for sensing light radiation. More particularly, the present invention relates to a unipolar photosensitive structure, in which the level of the dark current is significantly reduced, therefore improving the signal-to noise ratio. Furthermore, the invention relates to a method for producing such unipolar photosensitive structure.

BACKGROUND OF THE INVENTION

Photodiodes are widely used for sensing light radiation. There are many applications in which the level of the light which is required to be sensed is very low, and therefore the sensitivity of said photodiodes is a critical requirement.

It is well known in the art that the signal-to-noise ratio which can be obtained from photodiodes (and from many other electronic components) is limited by the level of the "thermal noise", which in turn is related to the temperature of the component. The term "dark current" is commonly used in the art to define the current flowing in a photodiode during a total dark condition. The signal-to-noise ratio in photodiodes is conventionally improved by cooling the component, in many cases down to very low temperatures close to 0° K. The means for cooling and maintaining such a low temperature in photodiodes, however, are cumbersome and expensive, and in any case can reduce the noise down to a limited value.

The dark current is generally composed of two main components. The first component, hereinafter referred to as "the diffusion dark current" is due to the thermal excitation of carriers across the complete energy bandgap of the photodiode material. As said, the level of this current can be reduced by means of cooling the component. The second component affecting the level of the dark current is known as the "Generation-Recombination" current (hereinafter "G-R dark current"). The level of the G-R dark current can also be reduced by cooling, but at a slower rate of reduction with temperature.

At low temperatures, where the level of the diffusion dark current is reduced sufficiently, the G-R dark current generally becomes the most dominant component of the dark current. There have been made many efforts in trying to reduce the level of the thermal noise. However, there are not known many of such efforts for reducing the G-R current.

FIG. 1 is a band diagram showing the principle of operation of a photodiode according to the prior art. In a semiconductor p-n junction 1-2, a depletion region 3 is formed around the metallurgical junction due to the transfer of electrons from donors in the n-side 2 of the depletion region to acceptors in the p-side 1. The conduction band ($E_C$) and valence band ($E_V$) are bent in the depletion region. This bending is associated with an electric field that drives electrons 7 towards the n-side and holes 8 towards the p-side of the junction. When a bias is applied to the junction, quasi Fermi levels can be defined in each of the two "flat-band" regions. The quasi Fermi level lies near the valence band on the p-side ($E_F(p)$) and near the conduction band on the n-side ($E_F(n)$). At zero bias, the energies of the two quasi Fermi levels are equal. The energy separation of the two quasi Fermi levels in electron-volts is equal to the applied bias in volts. If a reverse bias $V_{rev}$ is applied to the diode, the following relationship holds:

$$V_{rev} = E_F(p) - E_F(n).$$

The energy gap is given by $E_G = E_C - E_V$. Although $E_C$ and $E_V$ change with position due to the band bending in the depletion region, their energy separation is constant everywhere for a "homo-junction" diode ("homo-junction" means that the same material is used on each side of the p-n junction).

Light 9 can be absorbed by promoting an electron 119 from the valence band to the conduction band. The missing electron in the valence band is called a hole, and is indicated by numeral 118. The longest wavelength for this process is called the cut off wavelength and is given by: $\lambda_c = hc/E_G$, wherein h is Planck's constant and c is the velocity of light.

The "photo-created" hole 118 in process 9 exists in the n-type material 2 and so is a minority carrier. It can diffuse, as indicated by numeral 10 to the depletion region where it is accelerated 8 into the p-side 1 by the electric field in the depletion region 3. An analogous process (not shown explicitly) can occur in the p-type material 1 where a minority electron is created by the absorption of light. It can diffuse to the depletion region where it is accelerated 7 into the n-side 2 by the electric field in the depletion region 3.

Generation-Recombination (G-R) centers 4, also known as Shockley-Read traps or Shockley-Hall-Read traps, are energy levels that lie close to the middle of the band gap. They are related to imperfections or impurities inside the crystal. The probability of process 9 to occur due to heat (in the absence of an external photon flux) is essentially proportional to $\exp(-E_G/kT)$ where k is Boltzman's constant and T is the absolute temperature. This process (and the equivalent process on the p-side) gives rise to the "dark current" in a perfect diode with no G-R centers. In this case the dark current is all due to diffusion dark current, and the device is said to be at "the diffusion limit".

In an asymmetric $p^+$-n homo-junction, where the p-doping is several orders of magnitude greater than the n-doping, it can easily be shown that, generally, in the diffusion limit, the higher of the two minority carrier concentrations, in said $p^+$-n case the minority holes on the n-side, makes the dominant contribution to the dark current.

Since free electrons 7 and holes 8 are removed efficiently by the electric field in the depletion region 3, especially when a reverse bias is applied, an electron that undergoes excitation 5 from the valence band $E_V$ to the G-R center 4 cannot return to the valence band. It can only be further excited 6 to the conduction band. Processes 5, 6, 7, and 8 thus give rise to the G-R dark current.

The rate of electron generation by traps, in unit volume of the reverse biased depletion region 3 due to a process, 5, 6, 7, and 8, is approximately described by the formula $$G = \frac{n_i^2}{\tau_{n0} p' + \tau_{p0} n'} \tag{1}$$

where $n_i$ is the so called intrinsic carrier concentration (the carrier concentration in the perfectly pure material) and $\tau_{n0}$, $\tau_{p0}$ are the electron and hole minority carrier lifetimes. This formula may be found, for example, as equation (8.9.2) in chapter 8 of the book by Shyh Wang, entitled "Fundamentals of Semiconductor Theory and Device Physics" (published by Prentice Hall, ISBN 0-13-344425-2). Here $n' = n \cdot e^{(E_t - E_F)/kT}$ and $p' = p \cdot e^{(E_F - E_t)/kT}$ where n, p, and $E_F$ are the electron concentration, the hole concentration and the Fermi level respectively in a given sample of the semiconductor material, $E_t$ is the energy of the trap, and T is the absolute temperature. It can be demonstrated that G in equation (1) is largest when the trap lies near the middle of the energy bandgap. In this case it is easy to show using the above formulae, that $$G \approx \frac{n_i}{(\tau_{n0} + \tau_{p0})} \quad (2)$$

Under these conditions the G-R contribution to the dark current can become significant. From equation (2) it follows that G is then proportional to the intrinsic carrier concentration, the formula for which contains an exponential factor: $\exp(-E_G/2kT)$. The dark current due to generation-recombination centers which is itself proportional to this value of G will thus also vary essentially as: $\exp(-E_G/2kT)$. It is the weaker temperature dependence of the G-R contribution to the dark current ($\exp(-E_G/2kT)$) compared with the diffusion contribution ($\exp(-E_G/kT)$) that causes the G-R contribution to dominate at low temperatures. The ratio of the G-R dark current to the diffusion dark current in a $p^+$-n diode is often approximately given by equation (8.9.6) in chapter 8 of the earlier mentioned book by Shyh Wang, as:

$$\frac{J_{G-R}}{J_{diff}} = \frac{L_{dep}}{L_p} \times \frac{N_D}{n'} \quad (3)$$

where $L_{dep}$ is the thickness of the depletion region, and $N_D$ and $L_p$ are the doping and minority carrier diffusion length on the n-side of the junction. Typical values of $L_{dep}$ and $L_p$ are ~0.5 µm and 20 µm respectively.

Typical narrow gap homo-junction photo-diodes based on e.g. InSb, InAsSb, HgCdTe, etc., are in many cases operated at reduced temperatures, in order to limit the dark current. For such devices operated at 77K, G-R centers typically increase the dark current above the diffusion limit by at least 3-4 orders of magnitude in the MWIR (3-5 µm) and 1-2 orders of magnitude in the LWIR (8-12 µm) cut-off wavelength regions, behaviour that in each case is consistent with equation (3). This effect may easily be seen in J Bajaj, SPIE proceedings no. 3948 page 45 (FIG. 3 of this article), San Jose, January 2000, or in P C Klipstein et al., SPIE proceedings number 4820, page 653 (FIG. 2 of this article), Seattle, July 2002.

Until recently, the prior art has failed to specifically address the issue of suppressing the G-R contribution to the current by a suitable hetero-junction design. Previous attempts at suppressing the dark current have focused either on reducing the diffusion current from flat band regions close to the depletion region, or by suppressing the Auger contribution in devices operating close to room temperature. These works are summarized in the "Background of the Invention" section of WO 2005/004243 by the current applicant.

To our knowledge the only two works that do refer to the suppression of the G-R contribution to the dark current at low temperatures (where it is usually dominant) are the said WO 2005/004243 and an abstract entitled "InAsSb/GaAlSb/InAsSb nBn detector for the 3-5 µm" by S Maimon and G W Wicks that appeared in the book of abstracts of the 11th international conference on Narrow Gap Semiconductors (NGS-11) which took place in Buffalo, Jun. 16-20, 2003.

In the abstract of Maimon and Wicks a unipolar device is proposed exhibiting a suppressed G-R current, comprising two narrow bandgap n-type layers surrounding a wide bandgap barrier layer, in which there is negligible offset between the valence bands of the wide and narrow bandgap materials. It is claimed there that the device has no depletion region, but no information is disclosed on how this can be achieved when a bias is applied.

FIG. 2a illustrates a bipolar device according to the said WO 2005/004243 in which a "depletion-less" 29 photon absorbing region 13 is created within a p-n diode by inserting a suitable large bandgap barrier layer 14 between the n-type photon absorbing layer 13 and the p-type contact layer 15. The doping of this barrier layer 14 is critical in order to achieve a "depletion-less" photon absorbing region 13, and is most conveniently doped n-type, as in the example shown in FIG. 2a. In FIG. 2a the donor concentration in the barrier layer 14 has been tailored so that the p-type contact layer 15 may be biased to raise its valence band above that in the photon absorbing layer while at the same time maintaining entirely flat bands in the photon absorbing layer 13. In FIG. 2b, the band diagram is shown at a slightly lower bias, where the bands of the photon absorbing layer 13 next to the barrier layer are accumulated 21. Even in this case there is no depletion in the photon absorbing layer 13 and provided the lowest part of the valence band in the barrier layer 14 is not more that ~$10kT_{op}$ below the flat part of the photon absorbing layer 13, minority carriers created by photons absorbed in the photon absorbing layer 13 can be thermally excited across the barrier layer 14 and arrive in the contact layer 15 where they constitute a photocurrent which then passes through an external monitoring circuit. In both FIGS. 2a and 2b the only depleted regions 28 are those with bandgaps at least twice that of the photon absorbing layer 13. Hence, as described above, any G-R currents that they produce have a higher activation energy than that for the diffusion current produced in the photon absorbing layer 13 and so may be regarded as negligible. The device thus exhibits a dark current characteristic of a diffusion limited homojunction diode whose bandgap is similar to that of the photon absorbing layer 13. The examples in FIGS. 2a and 2b are based on a InAsSb photon absorbing layer 13, a GaAlAsSb barrier layer 14 and a GaSb contact layer 15. Other examples from WO 2005/004243 based on a GaInSb/InAs superlattice photon absorbing layer 33 are shown in FIGS. 2c and 2d. In FIG. 2d note that the bandgap of the superlattice contact layer 45 is similar to that in the photon absorbing layer 33. Any electrons generated by G-R centres in the contact layer 45 are blocked from transfer to the photon absorbing layer 33 by the tall barrier 34. They will eventually recombine with holes in the contact layer 45 and do not contribute to the current.

All of the previous devices discussed above, apart from that in Wicks and Maimon abstract, are BIPOLAR photodiodes with contacts to both n-type and p-type regions. All including that in Wicks and Maimon abstract are sensitive to a single wavelength band. It is an object of the present invention to provide a UNIPOLAR photosensitive device, sensitive to up to TWO wavelength bands, in which the dark current is significantly reduced, particularly at low temperatures, generally in the range of about 77 to 200° K., depending on the material and wavelength of operation. Advantages of the unipolar device over the bipolar one can include greater simplicity of manufacture of both single color and two color devices.

It is a particular object of the present invention to provide a photosensitive device in which the level of the G-R current is significantly suppressed at a given temperature.

It is still an object of the present invention to reduce the need for cooling, by providing a photosensitive structure having a level of dark current that would alternatively exist in a standard bipolar photodiode at much lower temperature.

It is still a further object of the invention to provide a method and process for manufacturing the photosensitive structure of the present invention.

Other objects and advantages of the present invention will become apparent as the description proceeds.

SUMMARY OF THE INVENTION

In a first embodiment, the present invention relates to a photo-detector with a reduced G-R noise, which comprises two n-type narrow bandgap layers surrounding a middle barrier layer having an energy bandgap at least equal to the sum of the bandgaps of said two narrow bandgap layers, wherein under flat band conditions the conduction band edge of each narrow bandgap layer lies below the conduction band edge of the barrier layer by at least the bandgap energy of the other narrow bandgap layer and wherein, when biased with an externally applied voltage, the more negatively biased narrow bandgap layer is the contact layer and the more positively biased narrow bandgap layer is the photon absorbing layer, and wherein under external bias conditions the bands in the photon absorbing layer next to the barrier layer are flat or accumulated, and the flat part of the valence band edge in the photon absorbing layer lies below the flat part of the valence band edge of the contact layer and it also lies an energy of not more than $10kT_{op}$ above the valence band edge in any part of the barrier layer, where k is the Boltzman constant and $T_{op}$ is the operating temperature.

Preferably, each of the narrow bandgap layers has a thickness of 0.1-10 μm with doping in the range $5\times10^{14}$ $cm^{-3} < n < 5\times10^{16}$ $cm^{-3}$.

Preferably, the barrier layer has a thickness of between 0.05 and 1 μm.

Preferably, the barrier layer is doped n-type with $n<1\times10^{17}$ $cm^{-3}$.

Preferably, the barrier layer is doped p-type with $p<1\times10^{17}$ $cm^{-3}$ and a p-n junction is formed between said barrier layer and an n-type δ-doping layer with $5\times10^{10}<n<10^{13}$ donors $cm^{-2}$ is included at the edge of the more positively biased narrow bandgap layer next to the barrier layer.

Preferably, one or both of the n-type narrow bandgap layers is terminated by a highly n-doped terminating layer, typically with $3\times10^{17}<n<3\times10^{18}$ donors $cm^{-3}$, and with typical thickness 0.05-4 μm, so that the valence band edge of said highly n-doped terminating layer lies below that of the adjacent n-type narrow bandgap layer.

Preferably, at least one of the narrow bandgap layers is made from an $InAs_{1-x}Sb_x$, alloy.

Preferably, the contact layer is GaSb.

Preferably, the narrow bandgap layers are made from type II superlattice materials which comprise alternating sub-layers of $InAs_{1-w}Sb_w$, and $Ga_{1-x-y}In_xAl_ySb_{1-z}As_z$ with $0 \leq w \leq 1$, $0 \leq x \leq 1$, $0 \leq y \leq 1$, $0 \leq z \leq 1$ and $x+y<1$ and wherein the sublayers each have a thickness in the range of 0.6-10 nm.

Preferably, the barrier layer is a $Ga_{1-x}Al_xSb_{1-y}As_y$ alloy with $0 \leq x \leq 1$ and $0 \leq y \leq 1$.

Preferably, the barrier layer is an $In_{1-x}Al_xSb_{1-y}As_y$ alloy.

In a second embodiment, the invention relates to a photo-detector with a reduced G-R noise, which comprises two n-type narrow bandgap layers surrounding a middle barrier layer having an energy bandgap significantly greater than the largest bandgap of said two narrow bandgap layers, wherein under flat band conditions the conduction band edge of each narrow bandgap layer lies below the conduction band edge of the barrier layer by at least half the bandgap energy of the other narrow bandgap layer and, wherein when biased with an externally applied voltage, the more negatively biased narrow bandgap layer is the contact layer and the more positively biased narrow bandgap layer is the photon absorbing layer, and wherein under external bias conditions the bands in the photon absorbing layer next to the barrier layer are flat or accumulated, and the flat part of the valence band edge in the photon absorbing layer lies below the flat part of the valence band edge of the contact layer and it also lies an energy of not more than $10kT_{op}$ above the valence band edge in any part of the barrier layer, where k is the Boltzman constant and $T_{op}$ is the operating temperature.

Preferably, each of the narrow bandgap layers has a thickness of 0.1-10 μm with doping in the range $5\times10^{14}$ $cm^{-3}<n<5\times10^{16}$ $cm^{-3}$.

Preferably, the barrier layer has a thickness of between 0.05 and 1 μm.

Preferably, the barrier layer is doped n-type with $n<1\times10^{17}$ $cm^{-3}$.

Preferably, the barrier layer is doped p-type with $p<1\times10^{17}$ $cm^{-3}$ and a p-n junction is formed between said barrier layer and an n-type δ-doping layer with $5\times10^{10}<n<10^{13}$ donors $cm^{-2}$, included at the edge of the more positively biased narrow bandgap layer next to the barrier layer.

Preferably, one or both of the n-type narrow bandgap layers is terminated by a highly n-doped terminating layer, typically with $3\times10^{17}<n<3\times10^{18}$ donors $cm^{-3}$, and with typical thickness 0.05-4 μm, so that the valence band edge of said highly n-doped terminating layer lies below that of the adjacent n-type narrow bandgap layer.

Preferably, the narrow bandgap layers are made from InSb or from $In_{1-x}Al_xSb$ alloys.

Preferably, the middle barrier layer is an $In_{1-x}Al_xSb$ alloy.

In a third embodiment, the invention relates to a photo-detector with a reduced G-R noise, which comprises two p-type narrow bandgap layers surrounding a middle barrier layer, said middle barrier layer having an energy bandgap significantly more than the largest bandgap of the two narrow bandgap layers and preferably equal to at least the sum of the bandgaps of the two narrow bandgap layers, wherein under flat band conditions the valence band edge of each narrow bandgap layer lies above the valence band edge of the barrier layer, by at least half and preferably all of the bandgap energy of the other narrow bandgap layer and wherein when biased with an externally applied voltage, the more positively biased narrow bandgap layer is the contact layer and the more negatively biased narrow bandgap layer is the photon absorbing layer, and wherein under external bias conditions the bands next to the barrier layer in the photon absorbing layer are flat or accumulated, and the flat part of the conduction band edge of the photon absorbing layer lies above the flat part of the conduction band edge of the contact layer and it also lies an energy of not more than $10kT_{op}$ below the conduction band edge in any part of the barrier layer, where k is the Boltzman constant and $T_{op}$ is the operating temperature.

Preferably, the photon absorbing layer has a thickness of 1-10 μm and doping of $p<2\times10^{16}$ $cm^{-3}$.

Preferably, the contact layer has a thickness of 0.1-10 μm and doping of $5\times10^{14}$ $cm^{-3}<p<1\times10^{18}$ $cm^{-3}$.

Preferably, the barrier layer is doped p-type, with $p<1\times10^{17}$ $cm^{-3}$.

Preferably, the barrier layer is doped n-type, typically $n<1\times10^{17}$ $cm^{-3}$ and a p-n junction is formed between said barrier layer and a p-type δ-doping layer with $5\times10^{10}<p<10^{13}$ acceptors $cm^{-2}$, included at the edge of the more negatively biased narrow bandgap layer next to the barrier layer.

Preferably, one or both of the p-type narrow bandgap layers is terminated by a highly p-doped terminating layer, typically with $3\times10^{17}<p<3\times10^{20}$ acceptors $cm^{-3}$, and with thickness typically 0.05-4 µm, so that the conduction band edge of said highly p-doped terminating layer lies above that of the adjacent p-type narrow bandgap layer.

The invention also relates to a photo-detector which comprises stacked detector sub-units as described above with respect to the first embodiment, wherein both of the n-type narrow bandgap layers in each of said sub-units is terminated by a highly n-doped terminating layer, and wherein an external contact is made to each of the resulting highly n-doped regions.

Preferably, the narrow bandgap layers of at least one sub-unit are made from $InAs_{1-x}Sb_x$ alloys.

Preferably, the narrow bandgap layers of at least one sub-unit are made from type II superlattice materials which comprise alternating sub-layers of $InAs_{1-w}Sb_w$ and $Ga_{1-x-y}In_xAl_ySb_{1-z}As_z$ with $0 \leq w \leq 1$, $0 \leq x \leq 1$, $0 \leq y \leq 1$, $0 \leq z \leq 1$ and x+y<1 and wherein the sub-layers each have a thickness in the range of 0.6-10 nm.

The invention also relates to a photo-detector which comprises stacked detector sub-units as described above with respect to the second embodiment, wherein both of the n-type narrow bandgap layers in each of said sub-units is terminated by a highly n-doped terminating layer, and wherein an external contact is made to each of the resulting highly n-doped regions.

Preferably, the narrow bandgap layers of the sub-units are made from InSb or from $In_{1-x}Al_xSb$ alloys.

The invention also relates to a photo-detector which comprises stacked detector sub-units as described above with respect to the third embodiment, wherein both of the p-type narrow bandgap layers in each of said sub-units is terminated by a highly p-doped terminating layer, and wherein an external contact is made to each of the resulting highly p-doped regions.

The invention also relates to an array of detectors in which each detector is as described above with respect to the first embodiment and where neither or one or both of the n-type narrow bandgap layers is terminated by a highly n-doped terminating layer, typically with $3 \times 10^{17} < n < 3 \times 10^{18}$ donors cm$^{-3}$, and with typical thickness 0.05-4 µm, and which is connected to a silicon readout circuit by an indium bump.

The invention also relates to an array of detectors in which each detector is as described above with respect to the second embodiment and where neither or one or both of the n-type narrow bandgap layers can be terminated by a highly n-doped terminating layer, typically with $3 \times 10^{17} < n < 3 \times 10^{18}$ donors cm$^{-3}$, and with typical thickness 0.05-4 µm, and which is connected to a silicon readout circuit by an indium bump.

The invention also relates to an array of detectors in which each detector is as described above with respect to the third embodiment and where neither or one or both of the n-type narrow bandgap layers can be terminated by a highly p-doped terminating layer, typically with $3 \times 10^{17} < n < 3 \times 10^{20}$ acceptors cm$^{-3}$, and with typical thickness 0.05-4 µm, and which is connected to a silicon readout circuit by an indium bump.

The invention also relates to an array of detectors each having the form of stacked detector sub-units as described above with respect to the first embodiment, wherein both of the n-type narrow bandgap layers in each of said sub-units is terminated by a highly n-doped terminating layer, in which each detector is sensitive to one or more wavelength band, and in which each detector is connected to a silicon readout circuit using one indium bump per detector sub-unit.

The invention also relates to an array of detectors each having the form of stacked detector sub-units as described above with respect to the second embodiment, wherein both of the n-type narrow bandgap layers in each of said sub-units is terminated by a highly n-doped terminating layer, in which each detector is sensitive to one or more wavelength band, and in which each detector is connected to a silicon readout circuit using one indium bump per detector sub-unit.

The invention also relates to an array of detectors each having the form of stacked detector sub-units as described above with respect to the third embodiment, wherein both of the p-type narrow bandgap layers in each of said sub-units is terminated by a highly p-doped terminating layer, in which each detector is sensitive to one or more wavelength band, and in which each detector is connected to a silicon readout circuit using one indium bump per detector sub-unit.

DETAILED DESCRIPTION OF PREFERRED EMBODIMENTS

Figure 1:
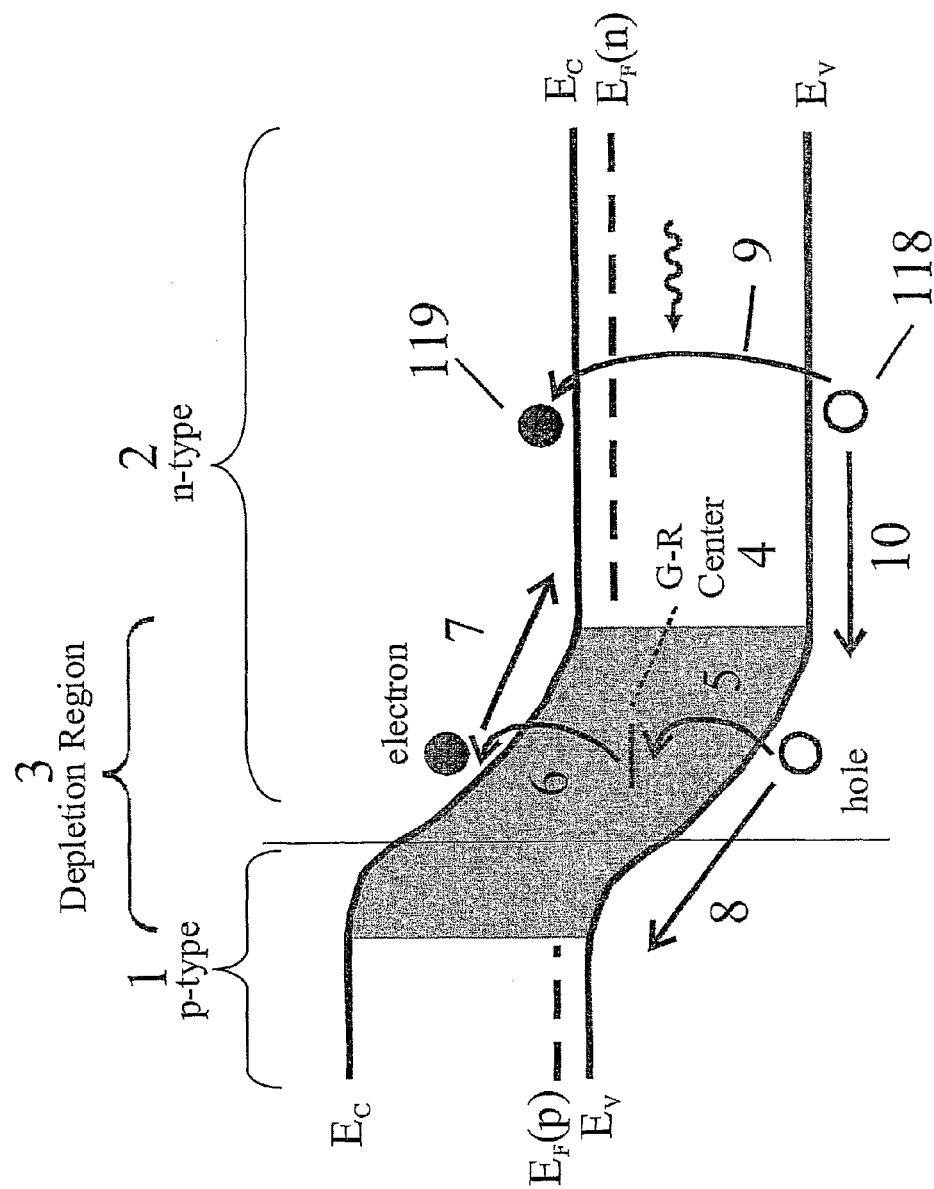
FIG. 1 shows an exemplary energy band diagram of a standard p-n homojunction photo-detector, and demonstrates the mechanisms of thermal generation of carriers due to G-R centres and of optical generation of carriers by means of photon absorption.
Figure 2A:
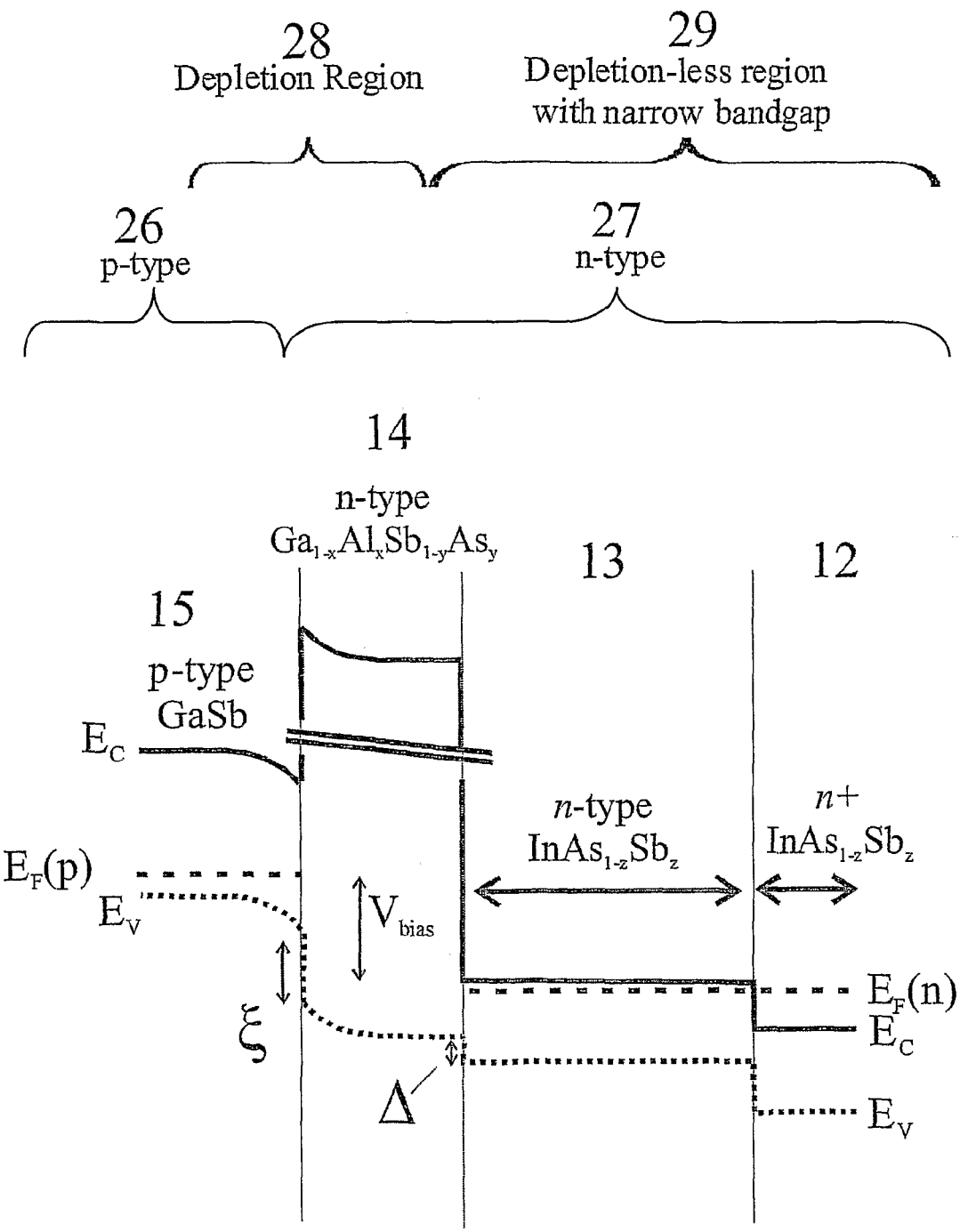
FIG. 2a shows an exemplary diagram of the conduction and valence band edges in a reduced dark current photo-detector described in WO 2005/004243 based on a p-type GaSb contact layer, an n-type $Ga_{1-x}Al_xSb_{1-y}As_y$ barrier layer and an n-type $InAs_{1-z}Sb_z$ photon absorbing layer, and operating at the maximum possible applied bias. An n+ $InAs_{1-z}Sb_z$ layer is also included after the photon absorbing layer which acts as a barrier for minority carriers in the photon absorbing layer. The depletion region exists in the contact and barrier layers but has been removed from the photon absorbing layer, which is the material in the device with the narrowest bandgap.
Figure 2B:
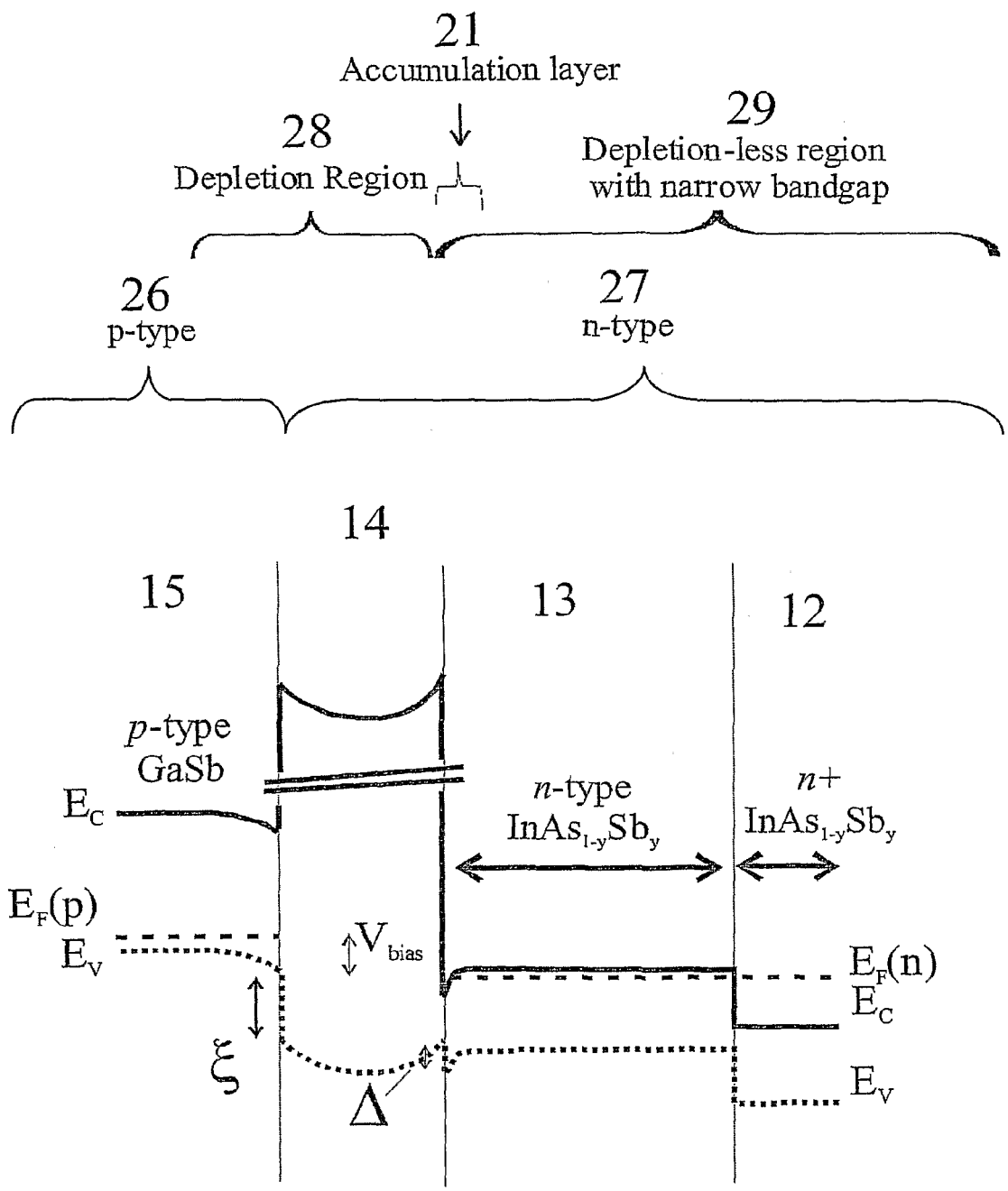
FIG. 2b shows the conduction and valence band edges in the same reduced dark current photo-detector as in FIG. 2a, but operating at a slightly lower bias than that applied in the case of FIG. 2a. An accumulation layer occurs at the edge of the n-type $InAs_{1-z}Sb_z$ photon absorbing layer next to the n-type $Ga_{1-x}Al_xSb_{1-y}As_y$ barrier layer
Figure 2C:
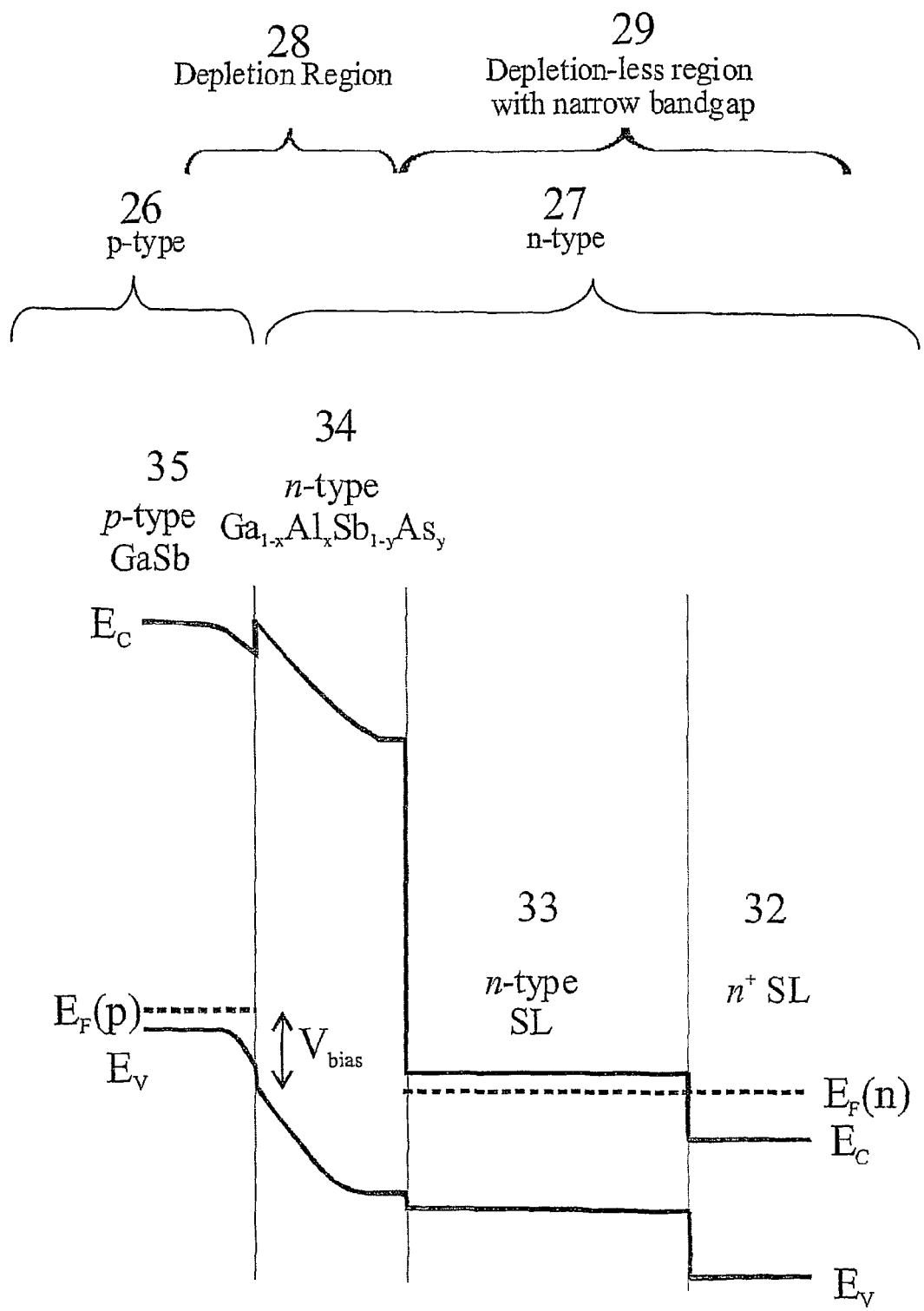
FIG. 2c shows an exemplary diagram of the conduction and valence band edges in a reduced dark current photo-detector described in WO 2005/004243 based on a p-type GaSb contact layer, an n-type $Ga_{1-x}Al_xSb_{1-y}As_y$ barrier layer and an n-type photon absorbing layer made from a type II superlattice and operating at the maximum possible applied bias. The type II superlattice comprises alternating sub-layers of $InAs_{1-w}Sb_w$ and $Ga_{1-x-y}In_xAl_ySb_{1-z}As_z$ with $0 \leq w \leq 1$, $0 \leq x-1$, $0 \leq y \leq 1$, $0 \leq z \leq 1$ and x+y<1 and wherein the sub-layers have a thickness in the range of 0.6-10 nm. An n+ layer made from a type II superlattice is also included after the photon absorbing layer which acts as a barrier for minority carriers in the photon absorbing layer. The depletion region exists in the contact and barrier layers but has been removed from the photon absorbing layer, which is the material in the device with the narrowest bandgap.
Figure 2D:
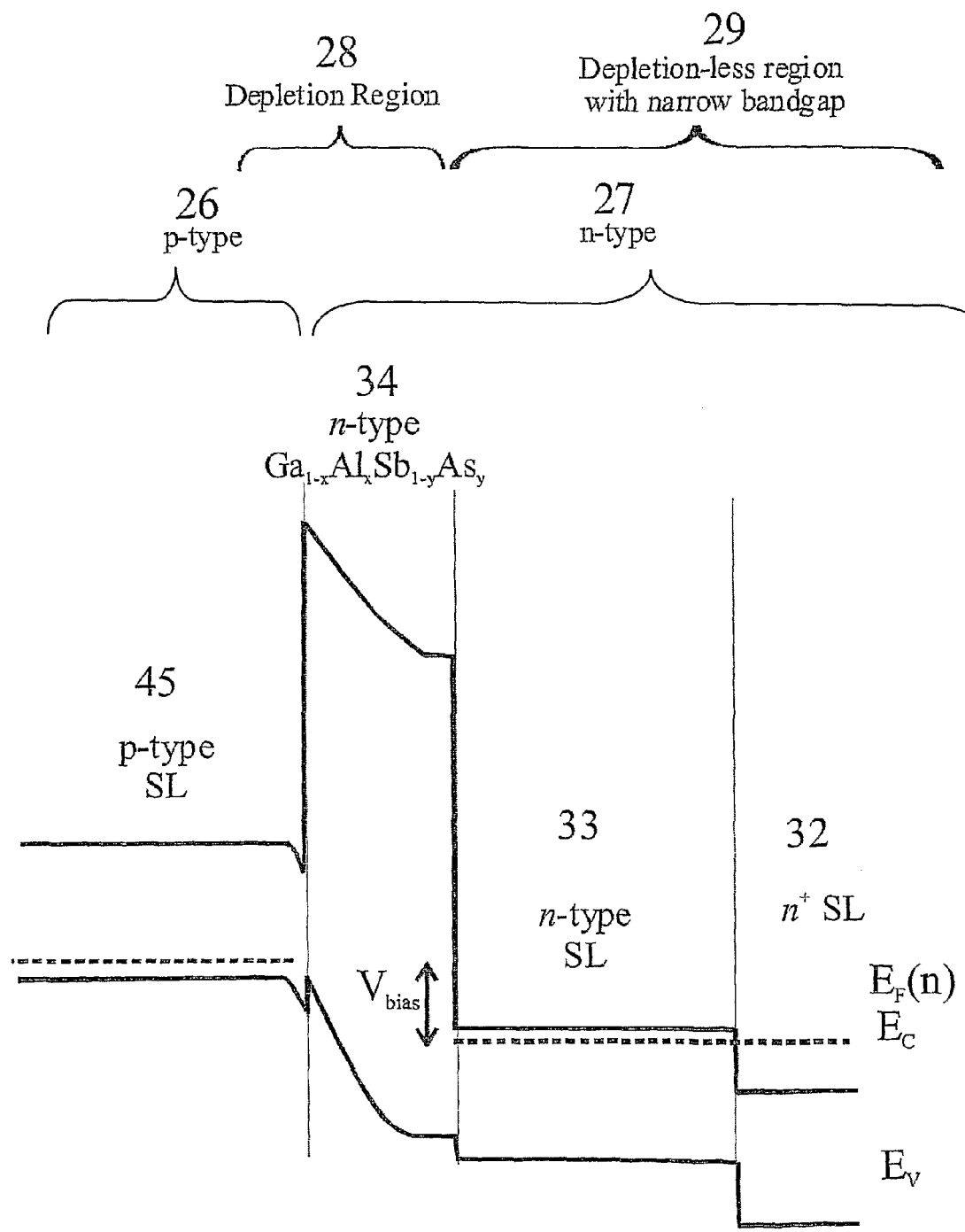
FIG. 2d shows an exemplary diagram of the conduction and valence band edges in a reduced dark current photo-detector described in WO 2005/004243 based on a p-type contact layer made from a type II superlattice, an n-type $Ga_{1-x}Al_xSb_{1-y}As_y$ barrier layer and an n-type photon absorbing layer made from a type II superlattice and operating at the maximum possible applied bias. The type II superlattice is as described for FIG. 2c. An n+ layer made from a type II superlattice is also included after the photon absorbing layer which acts as a barrier for minority carriers in the photon absorbing layer. The depletion region exists in the contact and barrier layers but has been removed from the photon absorbing layer, which is the material in the device with the narrowest bandgap.

As said, the present invention provides a unipolar photosensitive device which can be biased so that minority carriers created in the photon absorbing layer 53, 23, 83, 103 are collected by the contact layer 55, 75, 85, 105 and so that the dark level of the G-R current, and therefore the level of the total dark current is significantly reduced. This is of most importance in photodiodes and related devices that are cooled to low temperatures, typically in the range of 77° K. to 200° K., in which the G-R current can provide the most dominant contribution to the dark current.

Referring now to FIGS. 3a-3b and FIGS. 4a, 5a, 6a and 8a the present invention is characterized by the following features (for the sake of simplicity, these features will be referred to herein as "the characterizing features"):

1. A 3-layer, or two hetero-junction, light detector of the form of n-p-n or n-n-n is used (a hetero-junction is a junction between different materials), comprising two n-type narrow bandgap layers surrounding a middle barrier layer 54, 24, 74, 84, 104 that has an energy bandgap significantly larger than that of the two surrounding layers.

The last n-layer 53, 23, 83, 103 (depending on the specific embodiment used) has a narrow bandgap $E_G^\alpha$ chosen for its cut-off wavelength and absorbs the light impinged on the detector. Hereinafter, this said last, n-type layer, is also referred to as "the active photon absorbing layer".

The middle layer 54, 24, 74, 84, 104 (again, depending on the specific embodiment used) prevents tunneling of electrons from the conduction band (and at sufficiently high bias also from the valence band) of the first n-type layer 55, 75, 85, 105 to the conduction band of the photon-absorbing layer 53, 23, 83, 103. Hereinafter, this said middle layer is also referred to as "the barrier layer".

The first layer 55, 75, 85, 105 (depending on the specific embodiment used) has a narrow bandgap and acts as a contact for biasing the device. Hereinafter, this said first layer is also referred to as "the contact layer". The contact layer is biased negative with respect to the photon absorbing layer.

It is possible to make the contact layer much thinner than the photon absorbing layer. In this case its thickness should be sufficient only to make a suitable external contact to this layer. On the other hand it is also possible to make the two layers of a similar thickness, so that on reversing the bias they exchange roles. In this case, the contact layer becomes the photon absorbing layer while the photon absorbing layer becomes the contact layer.

2. The materials forming the photo-detector of the invention are chosen such that in a flat band condition the valence band of the photon absorbing layer 53, 23, 83, 103 is never more than about $10kT_{op}$ above the valence band of the barrier layer 54, 24, 74, 84, 104, where $T_{op}$ is the absolute operating temperature. Also in the same condition, the valence band energy of the contact-layer 55, 75, 85 105 is no more than $10kT_{op}$ below that of the barrier layer 54, 24, 74, 84, 104 which is below the conduction band of the photon-absorbing layer 53, 23, 83, 103. These conditions can be expressed mathematically as $-10kT_{op} \leq \Delta_1 \leq E_G^\alpha$, $E_G^C - \Delta_2 \geq 0$ and $10kT_{op} - \Delta_2 \geq 0$. $E_G^\alpha$ indicates the band-gap of the active photon-absorbing layer 53, 23, 83, 103 and $E_G^C$ indicates the band-gap of the contact layer 55, 75, 85, 105. $\Delta_1$ indicates the valence band offset between the barrier layer 54, 24, 74, 84, 104 and the active photon-absorbing layer 53, 23, 83, 103 (positive when the valence band of the barrier layer is highest in energy). Finally, $\Delta_2$ is the valence band offset between the contact-layer 55, 75, 85, 105 and the barrier layer 54, 24, 74, 84, 104 (positive when the valence band of the contact layer is lowest in energy).

3. When the photo-detector of the invention is biased to its maximum operating bias with an externally applied voltage, the bands in the photon absorbing layer 53, 23, 83, 103 are flat right up to the barrier layer. The photo-detector will also work at slightly lower bias values, when the edge of the photon absorbing layer 53, 23, 83, 103 next to the barrier layer 54, 24, 74, 84, 104 can become accumulated 210. During operation, the flat part of the valence band edge of the photon absorbing layer 53, 23, 83, 103 always lies below the flat part of the valence band edge of the contact layer 55, 75, 85, 105. The edge of the contact layer 55, 75, 85, 105 next to the barrier layer is accumulated both at maximum bias and at lower biases 210A.

4. During operation, a depletion region 280 is allowed only in the barrier layer 54, 24, 74, 84, 104 but not in the active photon-absorbing layer 53, 23, 83, 103. This is shown schematically in FIG. 3a for a n-n-n device where the contact layer 55, the barrier layer 54 and the active photon absorbing layer 53 are all doped n-type. The rate of generation 5A, 6A due to a G-R center 4A in the active photon absorbing layer 53 is very similar to the rate of recombination 60A, 50A, when the G-R centre is more than a diffusion length away from the depletion region 280. Closer to the depletion region 28 holes are removed by diffusion to the edge of the photon absorbing layer 53 so the recombination rate 60A, 50A falls, but the generation rate 5A, 6A is essentially unaffected. The generation rate 5A, 6A is strongly suppressed everywhere in the photon absorbing layer 53 due to the presence of majority carriers everywhere in this layer. In this case, equation (1) roughly describes the generation rate, but with n' replaced by the donor concentration, $N_D$. The G-R contribution to the dark current from the active photon-absorbing layer is in fact comparable to the diffusion dark current from this layer. The current flowing from this layer is therefore essentially diffusion limited.

5. The band-gap of the barrier-layer 54, 24, 74, 84, 104 is larger than that of the photon absorbing layer 53, 23, 83, 103. Ideally, it is at least twice that of the active photon-absorbing layer 53, 23, 83, 103 in which case the following equation will hold:

$$\exp(-E_G^{Barrier}/2kT) \leq \exp(-E_G^\alpha/kT) \tag{4}$$

wherein $E_G^{Barrier}$ indicates the band-gap of the barrier-layer 54, 24, 74, 84, 104. As shown schematically in FIG. 3b for a barrier layer 54, generation processes like 5B or 6B due to a G-R center 4B are activated respectively by energies $\alpha E_G^{barrier}$ and $(1-\alpha)E_G^{barrier}$. Since the theory presented earlier teaches that the G-R dark current in the barrier material 54 is significant only when the G-R center 4B is near the middle of the gap of the barrier material 54 ($\alpha \approx \frac{1}{2}$ in FIG. 3b), the G-R dark current will then vary as: $\exp(-E_G^{Barrier}/2kT)$. Hence, the inequality in equation (4) means that the G-R dark current contribution from the barrier-layer 54 should be comparable with, or less than the total contribution to the dark current due to the active photon-absorbing layer 53 which is diffusion limited as explained in the fourth item above, and varies as $\exp(-E_G^\alpha/kT)$.

6. For the n-type contact layer 55, 75, 85, 105, the doping is not too high (ideally $n<10^{16}$ cm$^{-3}$), otherwise the value of $\Delta_2$ is increased due to the Moss Burstein effect, making the conditions in item 2 harder to uphold.

7. In the n-type contact layer 55, 75, 85, 105 which has only flat or accumulated regions, G-R processes are suppressed in the same way as for the photon absorbing layer 53, 23, 83, 103 as discussed above in item 4. In addition any electrons that are generated by G-R processes equivalent to 5A and 6A (shown for the photon absorbing layer 53 in FIG. 3A) cannot contribute to the current in the device due to the presence of the barrier layer 54, 24, 74, 84, 104 which blocks their transfer into the photon absorbing layer 53, 23, 83, 103.

Figure 3A:
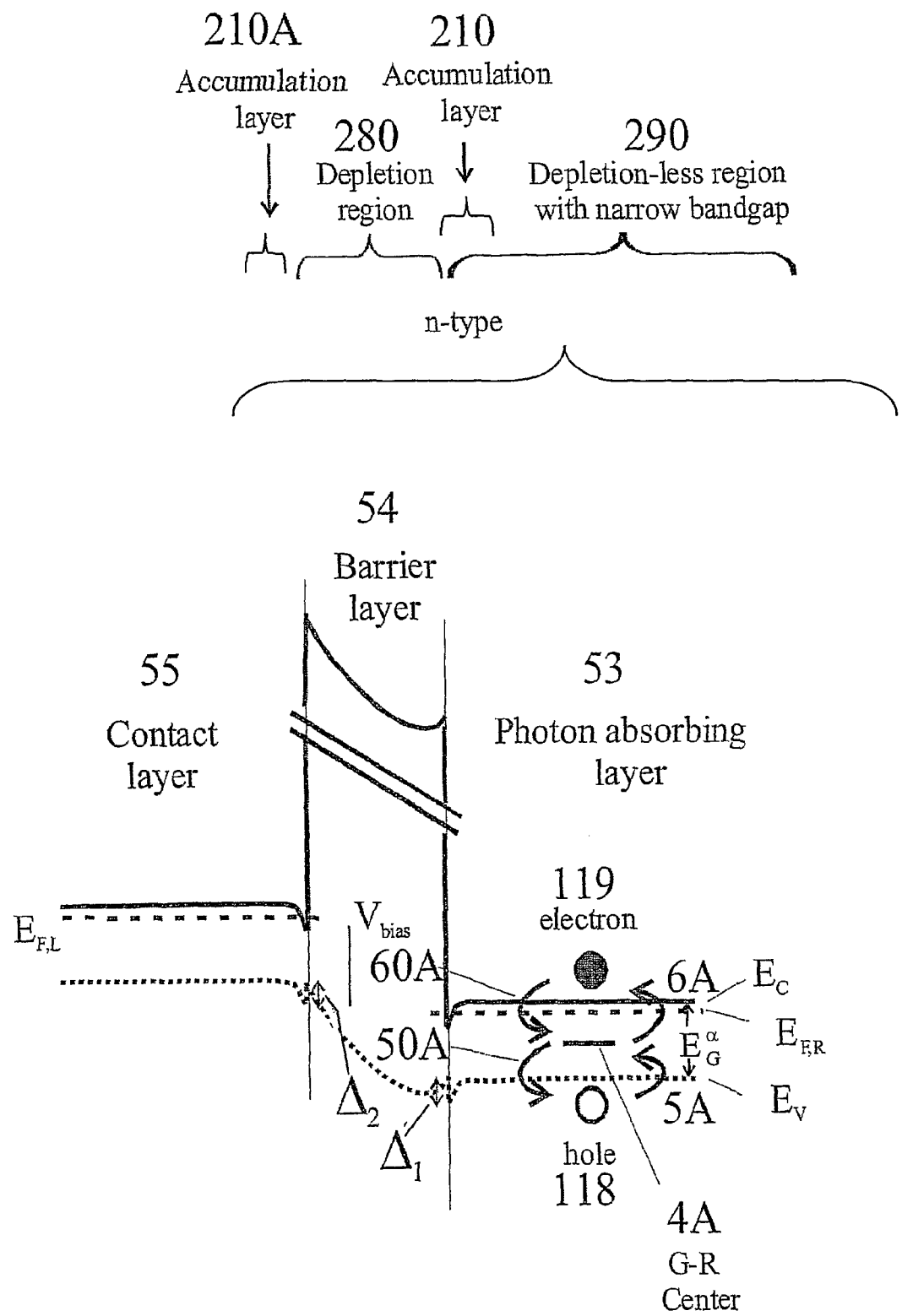
FIG. 3a shows an exemplary energy band diagram of an essential part of a reduced dark current photo-detector operating at a bias slightly lower than the maximum possible bias and corresponding to an embodiment of the present invention in which the depletion region is removed from the narrow bandgap n-type photon absorbing material. Electron accumulation layers are formed in the n-type narrow bandgap contact and photon absorbing layers, next to their respective sides of the wide bandgap barrier layer. Thermal generation and recombination of electrons and holes by a near mid-gap G-R centre is demonstrated in the narrow bandgap photon absorbing material.
Figure 3B:
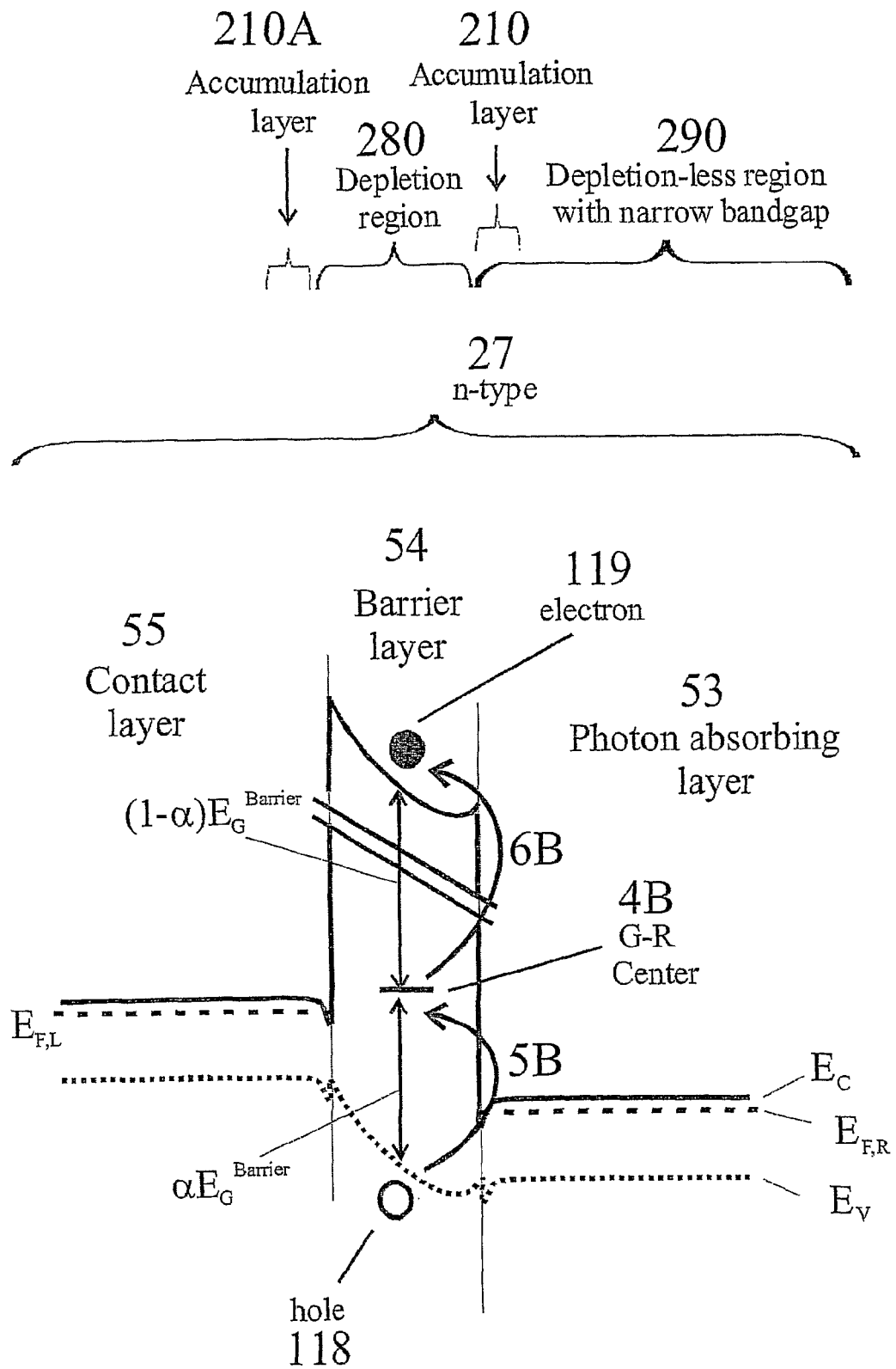
FIG. 3b shows the same energy band diagram as in FIG. 3a. The thermal generation of electrons and holes by a G-R centre in the bandgap of the wide bandgap barrier material is demonstrated. The wide bandgap barrier material also contains the depletion region.

8. For the n-type contact layer 55, 75, 85, 105, its conduction band lies below the conduction band of the barrier layer 54, 24, 74, 84, 104 by more than half the bandgap energy of the photon absorbing layer, $0.5E_G^\alpha$. Ideally, the conduction band of the n-type contact layer 55, 75, 85 105 should lie at least an energy $E_G^\alpha$ below the conduction band of the barrier layer 54, 24, 74, 84, 104. In general, the activation energy for electrons passing from the contact layer 55, 75, 85, 105 into the barrier layer 54, 24, 74, 84, 104 will then be greater than $E_G^\alpha$. Under these circumstances, and provided that the doping in the contact layer 55, 75, 85, 105 is not too high, the current due to this process will be less than the diffusion current from the photon absorbing layer 53, 23, 83, 103 which also has an activation energy of $E_G^\alpha$. In FIGS. 3a, 3b the conduction band of the contact layer 55 lies below the conduction band in the barrier layer 54 by more than $E_G^\alpha$.

Furthermore, the barrier layer 54, 24, 74, 84, 104 is made sufficiently thick to suppress any tunnel current of electrons from the conduction band, or at sufficiently high biases, also the valence band, of the n-type contact layer 55, 75, 85, 105 to the conduction band of the active photon absorbing layer 53, 23, 83, 103. Any such tunnel current must be less than the dark current in the device due to other processes.

The doping of the barrier layer 54, 24, 74, 84, 104 (and to a lesser degree that in the n-type contact layer 55, 75, 85, 105) is chosen according to the present invention to adjust the operating bias to a desirable value. An n-type δ-doping layer 20, 80, 100 may also be included between the photon absorbing layer 53, 23, 83, 103 and the barrier layer 54, 24, 74, 84, 104. This is optional in the case of a n-type barrier layer 54, 24, 84, 104 because it can sometimes increase the range of bias over which the bands of the active photon-absorbing layer remain flat 53, 23, 83, 103, even close to the junction with the barrier layer 54, 24, 84, 104. It is essential in the case of a p-type barrier layer 74 in order to ensure that the bands of the photon absorbing layer 23 are not depleted close to the barrier layer 74.

Figure 3C:
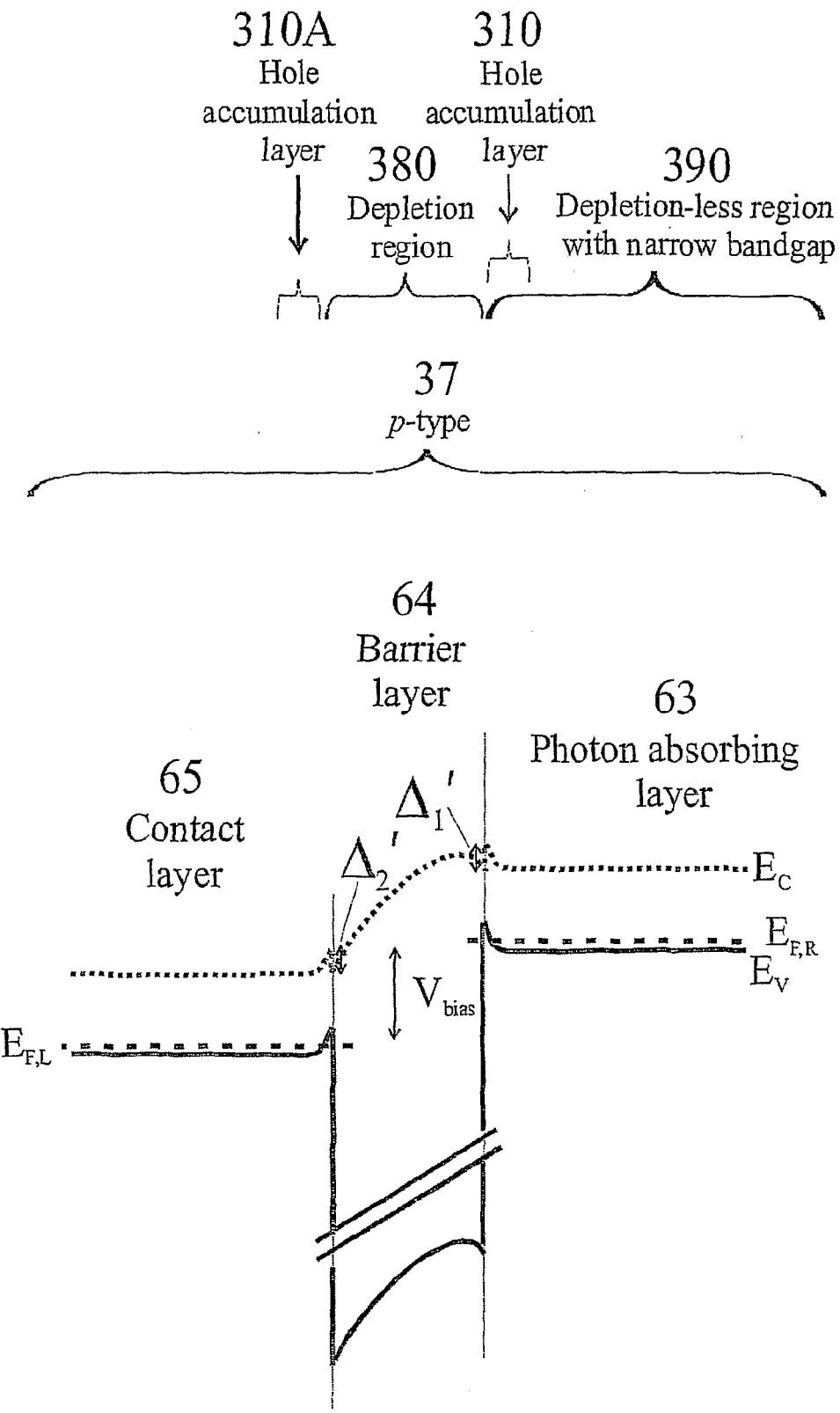
FIG. 3c exemplifies the band diagram of an essential part of one possible embodiment of the hetero-junction photo-detector of the present invention, in which the doping polarities of the photon absorbing, barrier and contact layers have been reversed compared with the embodiment in FIGS. 3a and 3b.

9. The principles of the present invention described above also apply to inverted polarity structures of the form p-p-p or p-n-p in which all the doping polarities and band alignments described above are reversed. An example is shown in FIG. 3c of a p-p-p structure that is the reversed polarity form of the n-n-n structure depicted in FIGS. 3a-3b. The photon absorbing layer 63, contact layer 65, and barrier layer 64 are all p-type. Characterizing items 2 and 3 above, apply to all inverted polarity structures if the following words are interchanged: "highest" with "lowest", "higher" with "lower", "valence" with "conduction" and "above" with "below". The mathematical expressions in the characterizing item 2 above are then replaced by $-10kT_{op} \leq \Delta_1' \leq E_G^{\alpha'}$, $E_G^{C'} - \Delta_2' \geq 0$ and $10kT_{op} - \Delta_2' \geq 0$. $E_G^{\alpha'}$ and $E_G^{C'}$ indicate the band-gap of the active photon-absorbing layer 63 and the contact layer 65 respectively. $\Delta_1'$ indicates the conduction band offset between the barrier layer, such as 64, and the active photon-absorbing layer, such as 63 (positive when the conduction band of the barrier layer is lowest in energy). $\Delta_2'$ is the conduction band offset between the contact-layer, such as 65, and the barrier layer, such as 64 positive when the conduction band of the contact layer is highest in energy). During operation at maximum applied bias, an electric field and associated depletion layer 380 is not allowed in the active photon absorbing layer, such as 63. The photo-detector will also work at slightly lower bias values, when the edge of the photon absorbing layer next to the barrier layer can become accumulated 310. The bandgap of the barrier layer, such as 64, is more than, and ideally at least twice, that of the active photon absorbing layer, such as 63. The edge of the contact layer 65 is usually accumulated both at maximum bias and at lower biases 310A.

For the p-type contact layer 65 its valence band lies above the valence band of the barrier layer 64 by more than half the bandgap energy of the photon absorbing layer, $0.5E_G^{\alpha'}$. Ideally, the valence band of the p-type contact layer 65 should lie at least $E_G^{\alpha'}$ above the valence band of the barrier layer 64.

Embodiment 1

Figure 4A:
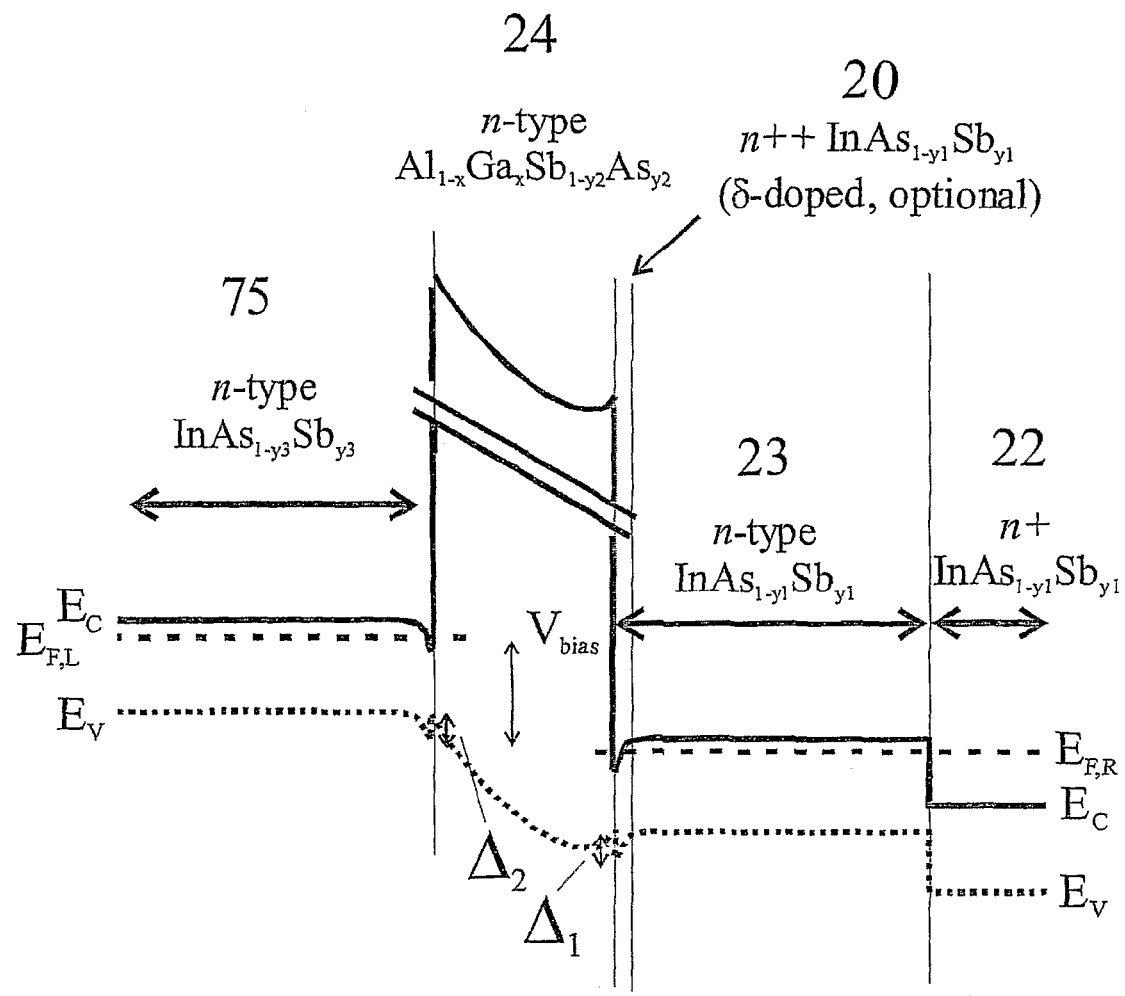
FIG. 4a shows the band diagram of a first embodiment of the hetero-junction photo-detector of the present invention, having an InAsSb photon absorbing layer which is biased positive with respect to an InAsSb contact layer.
Figure 4B:
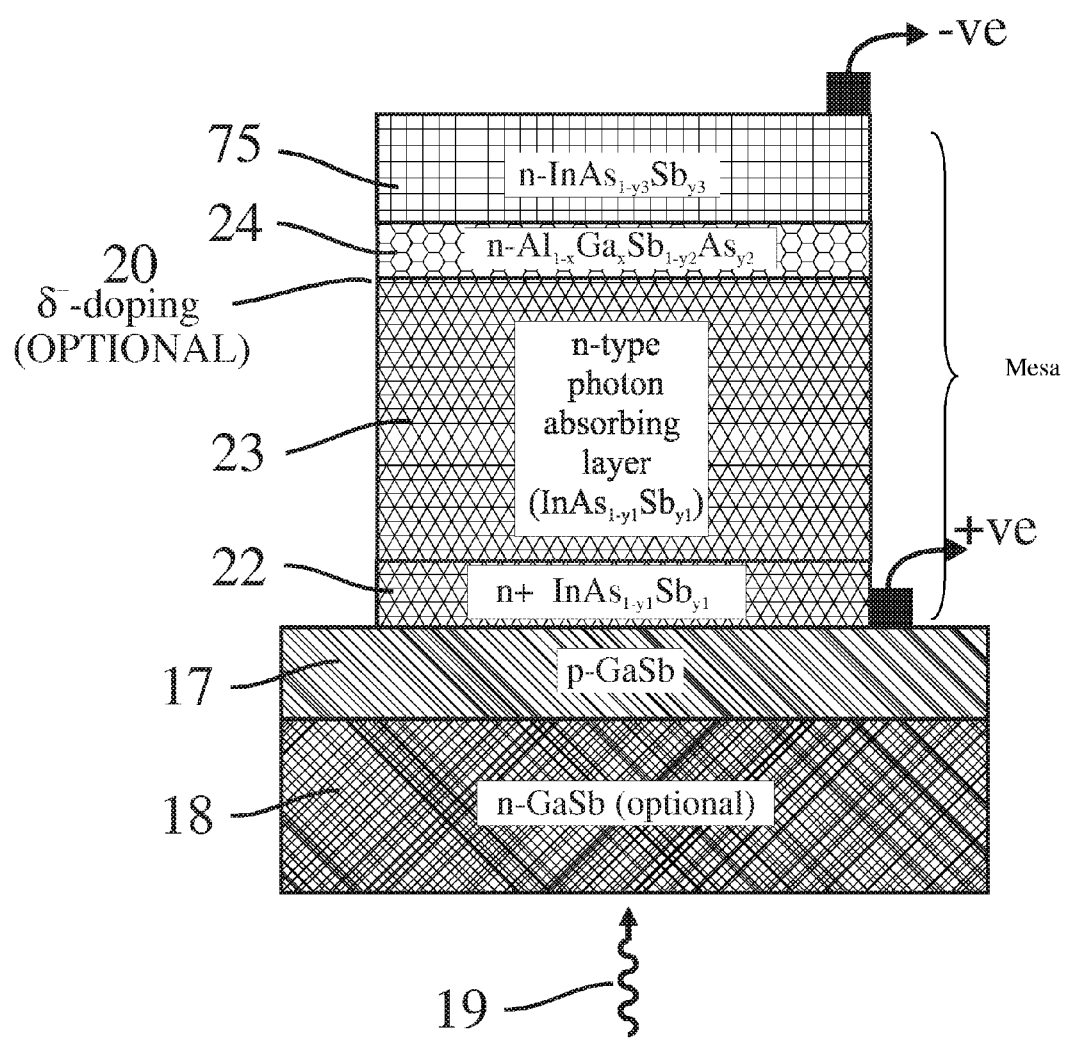
FIG. 4b illustrates in a schematic cross-section form, a possible structural arrangement of a first embodiment of the hetero-junction photo-detector of the present invention, having an InAsSb photon absorbing layer which is biased positive with respect to an InAsSb contact layer.
Figure 4C:
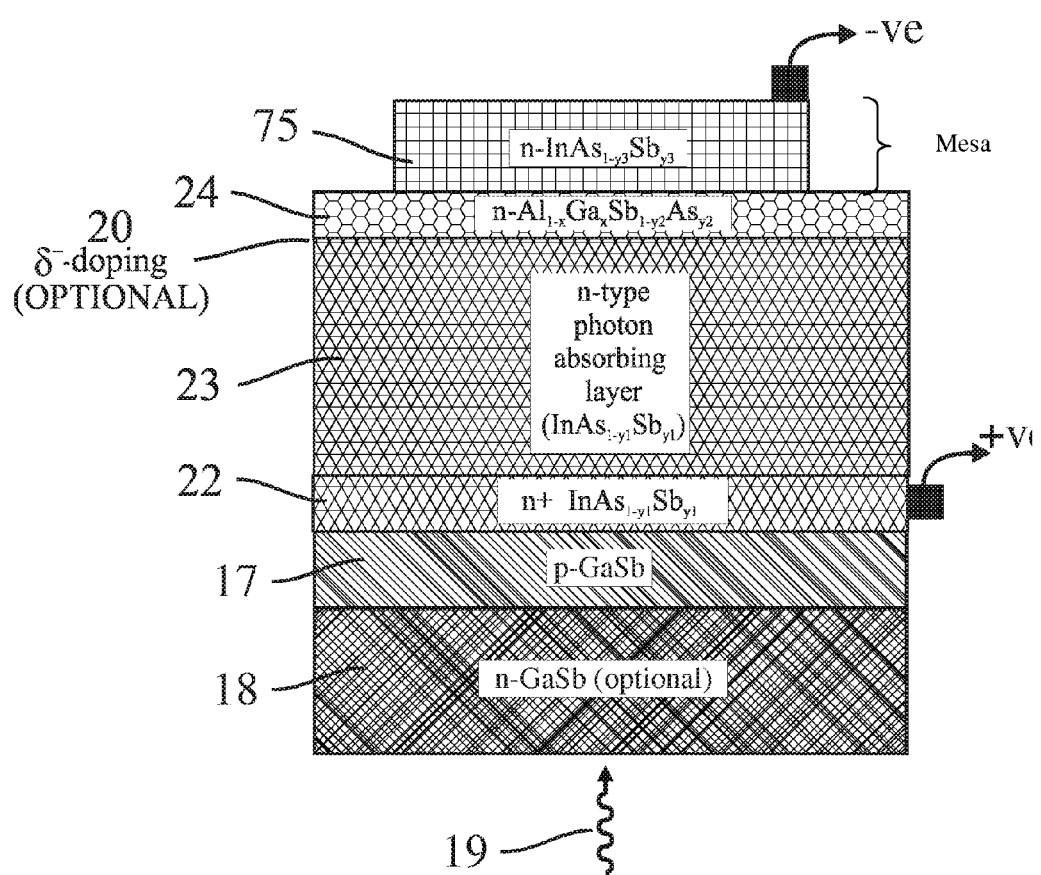
FIG. 4c illustrates in a schematic cross-section form, an alternative structural arrangement to that shown in FIG. 4b, of a first embodiment of the hetero-junction photo-detector of the present invention, having an InAsSb photon absorbing layer which is biased positive with respect to an InAsSb contact layer.

A band diagram of a first embodiment of the invention is shown in FIG. 4a. Examples of the structure of said first embodiment are shown in FIGS. 4b and 4c. In the first embodiment, band bending is allowed in the barrier layer 24 and a short distance into the contact layer 75. Band bending in the contact layer 75 is usually due to electron accumulation close to the barrier (210A in FIG. 3a). The bands in the photon absorbing layer 23 are flat at the maximum operating bias but a small accumulation layer of electrons (210 in FIG. 3a) forms close to the barrier layer at lower bias, as shown in FIG. 4a.

The n-type photon-absorbing layer 23 is made of InAsSb alloy. The doping is typically in the range of $n < 2 \times 10^{16}$ cm$^{-3}$ and the thickness is typically in the range 1-10 µm.

The use of InAsSb enables operation in the MWIR atmospheric transmission window (3-5 µm).

The contact layer 75 is made of n-type InAsSb with typical values of doping in the range $5 \times 10^{14} < n < 5 \times 10^{16}$ cm$^{-3}$ and thickness>0.1 µm.

The barrier layer 24 is made of GaAlSbAs alloy, with thickness typically in the range of 0.05-1 µm.

The barrier layer 24 is n-type with a typical doping range of $1 \times 10^{15} \leq n < 1 \times 10^{17}$ cm$^{-3}$.

An n-type δ-doping layer 20, having a typical doping of $5 \times 10^{10} < n < 10^{18}$ cm$^{-2}$, may be included between the photon absorbing layer 23 and the barrier layer 24, as an option.

Embodiment 2

Figure 5A:
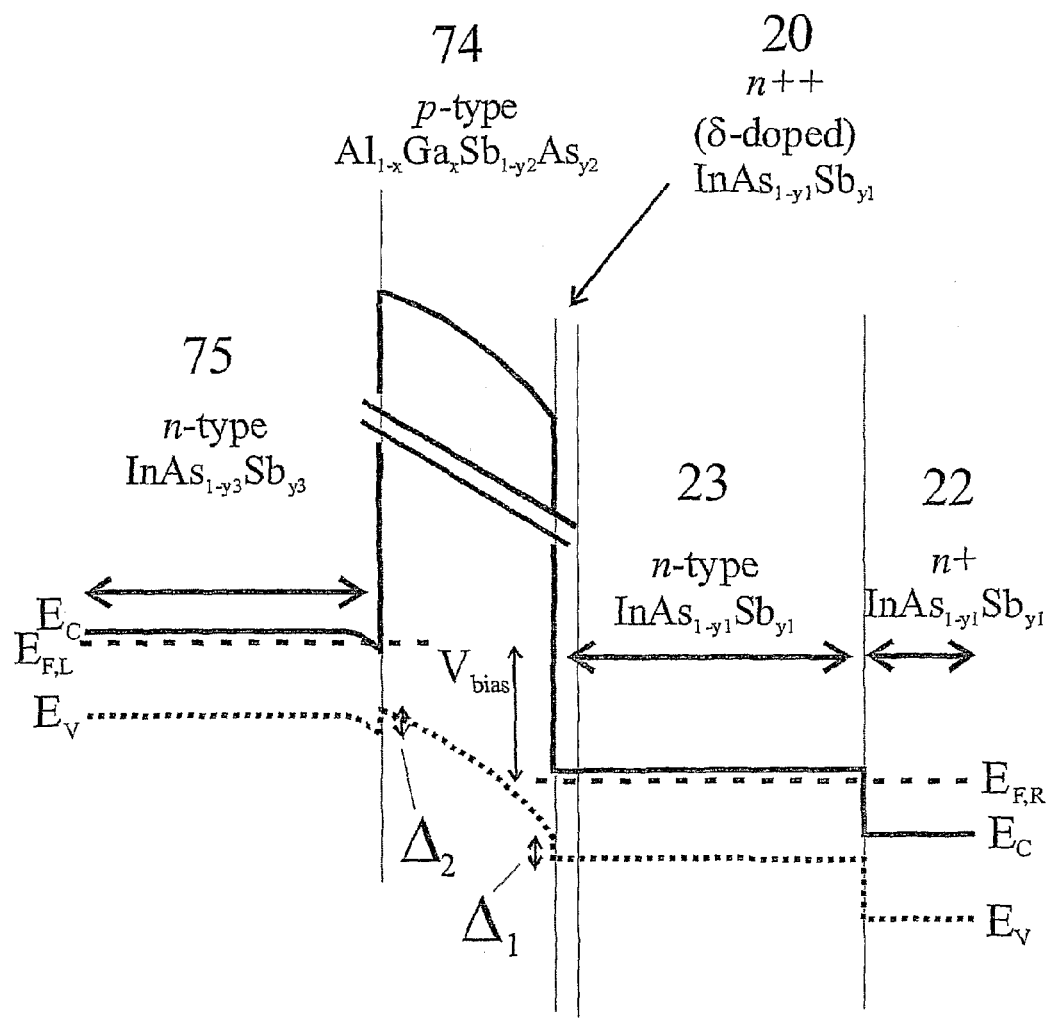
FIG. 5a shows the band diagram of a second embodiment of the hetero-junction photo-detector of the present invention, having an InAsSb photon absorbing layer which is biased positive with respect to an InAsSb contact layer.
Figure 5B:
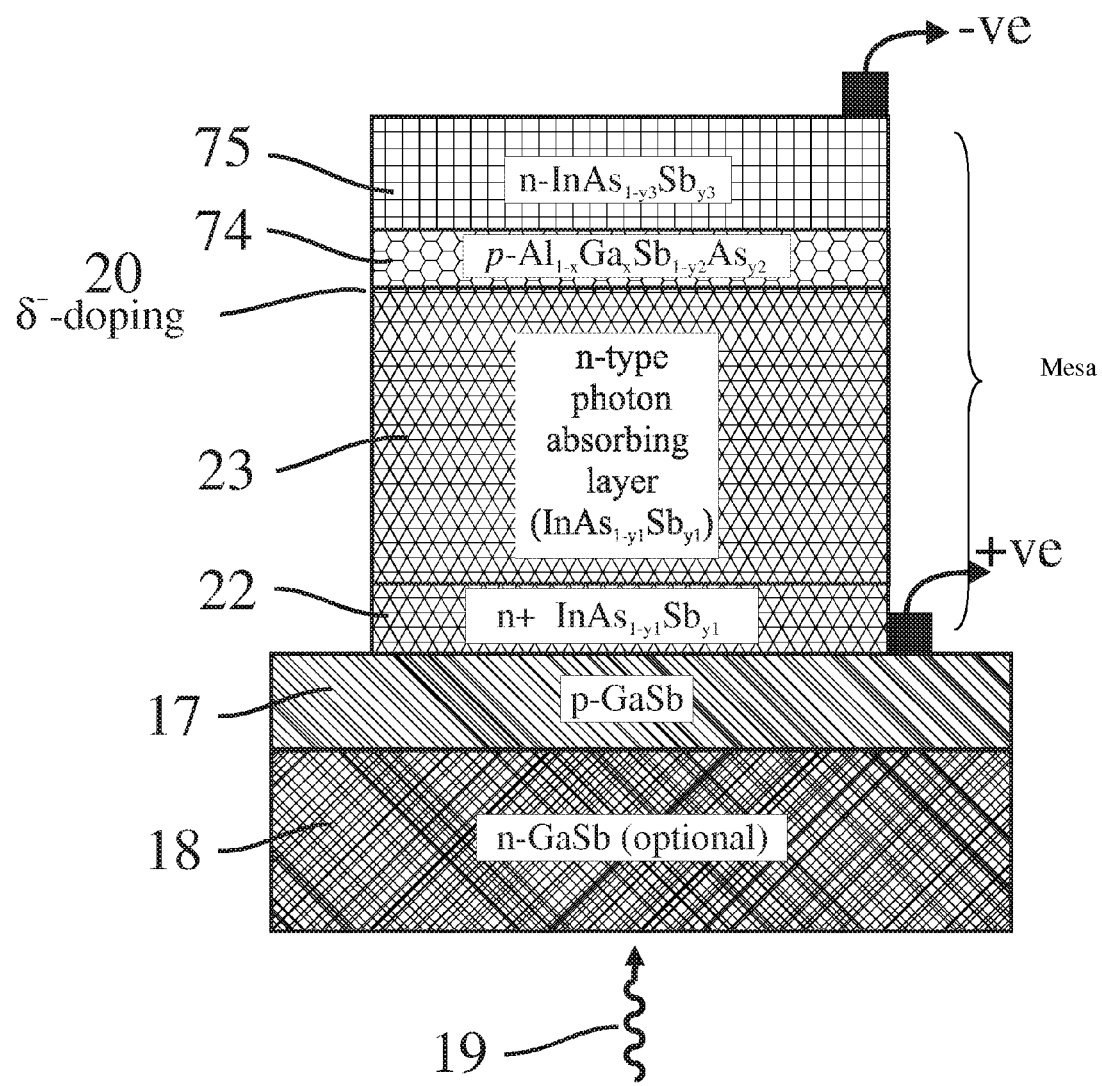
FIG. 5b illustrates in a schematic cross-section form, a possible structural arrangement of a second embodiment of the hetero-junction photo-detector of the present invention, having an InAsSb photon absorbing layer which is biased positive with respect to an InAsSb contact layer.

A band diagram of a second embodiment of the invention is shown in FIG. 5a. An example of the structure of said second embodiment is shown in FIG. 5b. The n-type photon-absorbing layer 23 is made of InAsSb alloy. The doping is typically in the range $n < 2 \times 10^{16}$ cm$^{-3}$, and the thickness of the photon-absorbing layer 23 is typically in the range 1-10 µm. The use of InAsSb enables operation in the MWIR atmospheric transmission window (3-5 µm). The contact layer 75 is made of n-type InAsSb with typical values of doping in the range $5 \times 10^{14} < n < 5 \times 10^{16}$ cm$^{-3}$ and thickness>0.1 µm.

The barrier layer 74 is made of GaAlSbAs alloy with thickness values typically in the range 0.05-1 µm. The barrier layer 74 is a p-type material, with a typical doping range of $1 \times 10^{14} \leq p < 1 \times 10^{17}$ cm$^{-3}$. A depletion region exists in the GaAlSb barrier layer 74 but not in the photon absorbing layer 23. The depletion region exists in the barrier layer but its electric field is allowed to extend a short distance into the n-type contact layer 75 where an electron accumulation layer 210A usually exists next to the barrier layer 74.

The boundary of the n-type photon absorbing layer 23 nearest the p-type barrier layer 74 is doped over a few, ideally just one or two, atomic monolayers with donor atoms such as, silicon, to form a δ-doping layer 20 having a typical doping of: $5 \times 10^{10} < n < 10^{13}$ cm$^{-2}$.

Embodiment 3

Figure 6A:
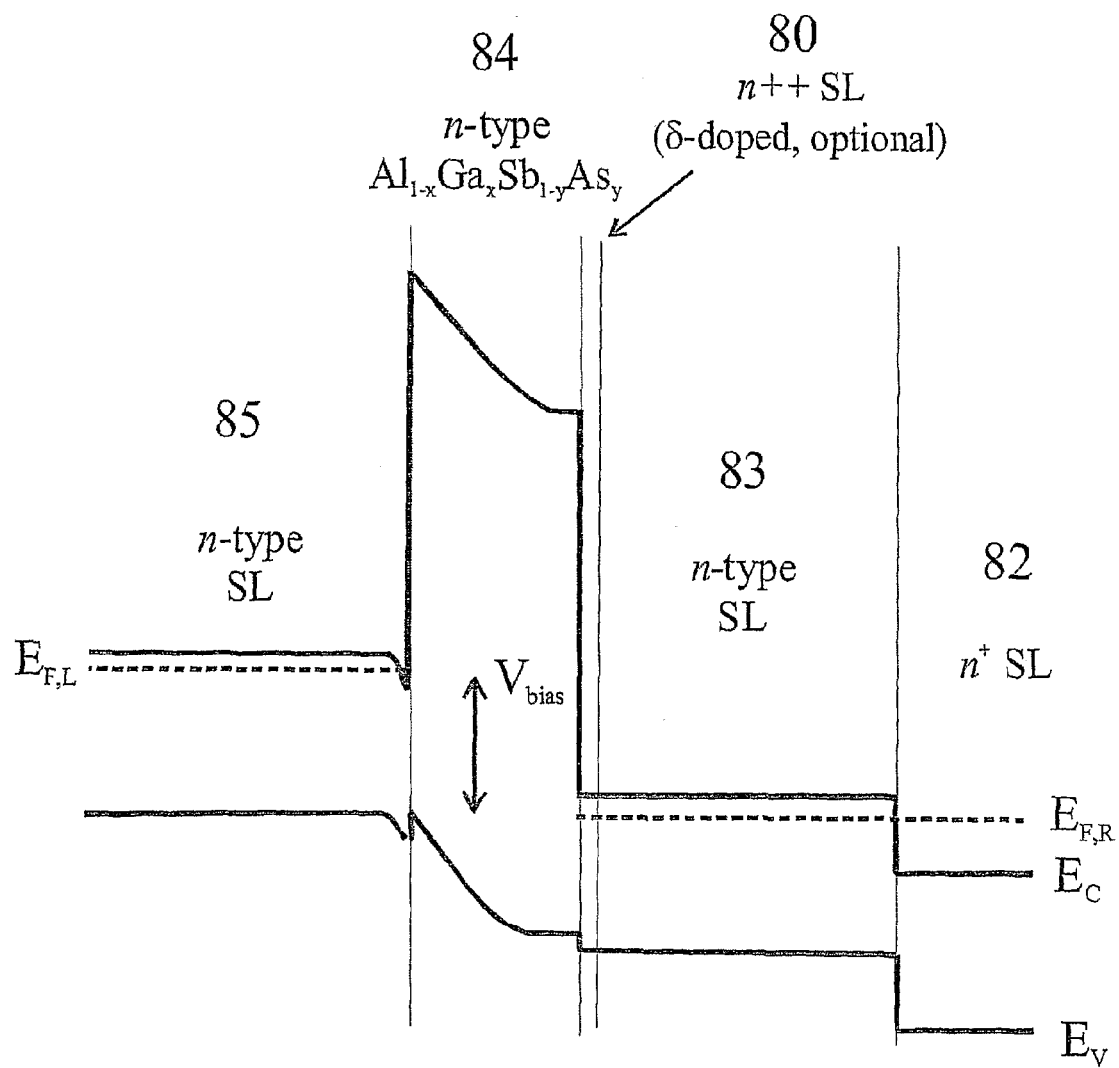
FIG. 6a shows the band diagram of a third embodiment of the hetero-junction photo-detector of the present invention, having a photon absorbing layer made from a type II superlattice which is biased positive with respect to contact layer made from a type II superlattice
Figure 6B:
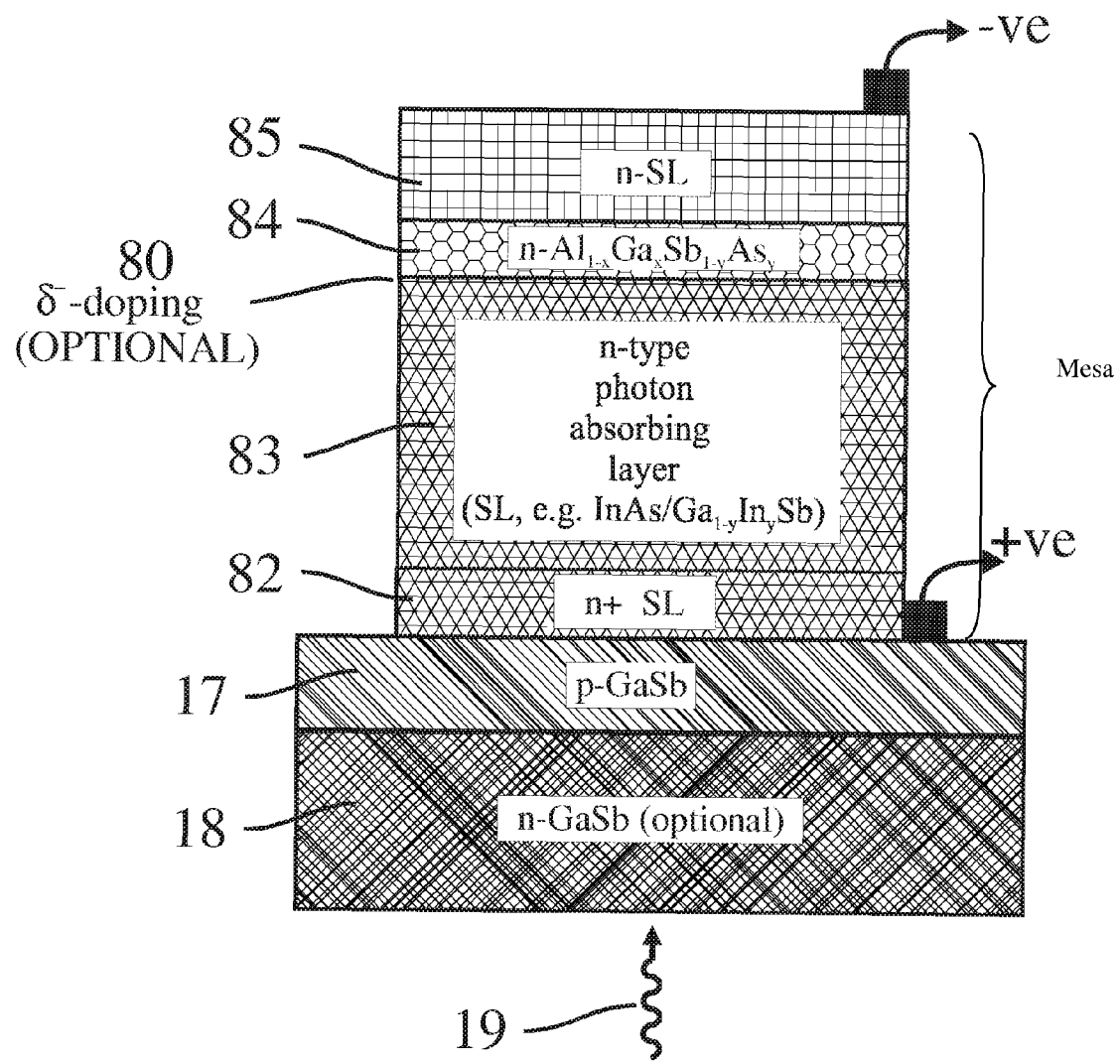
FIG. 6b illustrates in a schematic cross-section form, a possible structural arrangement of a third embodiment of the hetero-junction photo-detector of the present invention, having a photon absorbing layer made from a type II superlattice which is biased positive with respect to contact layer made from a type II superlattice

A band diagram of a third embodiment of the invention is shown in FIG. 6a. An example of the structure of said third embodiment is shown in FIG. 6b.

The n-type photon-absorbing layer 83 and the n-type contact layer 85 are both made from type II superlattice materials that comprise alternating sub-layers of InAs and $Ga_{1-x}In_xSb$ (or alternating sub-layers of closely related semiconductor alloys, e.g. $InAs_{1-w}Sb_wGa_{1-x-y}In_xAl_ySb_{1-z}As_z$, etc. with $0 \leq w \leq 1, 0 \leq x \leq 1, 0 \leq y \leq 1, 0 \leq z \leq 1$ and $x+y<1$) and wherein the sub-layers each have a thickness typically in the range of 0.6-10 nm. In the photon absorbing layer 83 the average doping over many sub-layers of the superlattice is typically in the range $n < 2 \times 10^{16}$ cm$^{-3}$, and the thickness of the whole superlattice region is typically in the range 1-10 µm.

As known in the art, the use of a type II InAs/InGaSb (or closely related) superlattice material enables operation in both the Mid-Wave Infra-Red (MWIR: 3-5 µm) and in the Long-Wave Infra-Red (LWIR: 8-12 µm) terrestrial atmospheric transmission windows, and also in the Very Long-Wave Infra-Red (VLWIR: 12-20 µm) range. This versatility of cut-off wavelength is an important advantage of this embodiment.

The contact layer 85 has an average doping over many sub-layers of the superlattice material, typically in the range $5 \times 10^{14} < n < 5 \times 10^{16}$ cm$^{-3}$ and a total thickness>0.1 µm.

The barrier layer 84 is made of GaAlSbAs alloy with typical thickness values in the range 0.05-1 µm.

The barrier layer 84 is n-type with a typical doping range of $1\times10^{15} \leq n < 1\times10^{17}$ cm$^{-3}$.

An n-type δ-doping layer 80, having a typical doping of $5\times10^{10} < n < 10^{13}$ cm$^{-2}$, may be included between the photon absorbing layer and the barrier layer as an option.

As shown in FIG. 6a, a depletion region exists in the n-type barrier layer 84 and an accumulation layer of electrons usually exists in the contact layer 85 next to the barrier layer 84 (280 and 210A respectively in the general FIG. 3a). At maximum bias (shown in FIG. 6a) the bands in the photon absorbing layer 83 are flat everywhere, while at lower bias an accumulation layer (210 in general FIG. 3a) occurs in the photon absorbing layer 83 next to the barrier layer 84.

Although the valence band offsets between the barrier layer 84 and the photon absorbing layer 83 and between the barrier layer 84 and the contact layer 85 (respectively $\Delta_1$ and $\Delta_2$ in general FIG. 3a) are shown positive in FIG. 6a, they may be made negative up to a most negative value of about $-10kT_{op}$ by changing the amount of aluminum and arsenic in the barrier layer 84. Ideally the magnitude of said offsets should be as small as possible.

Embodiment 4

Figure 7A:
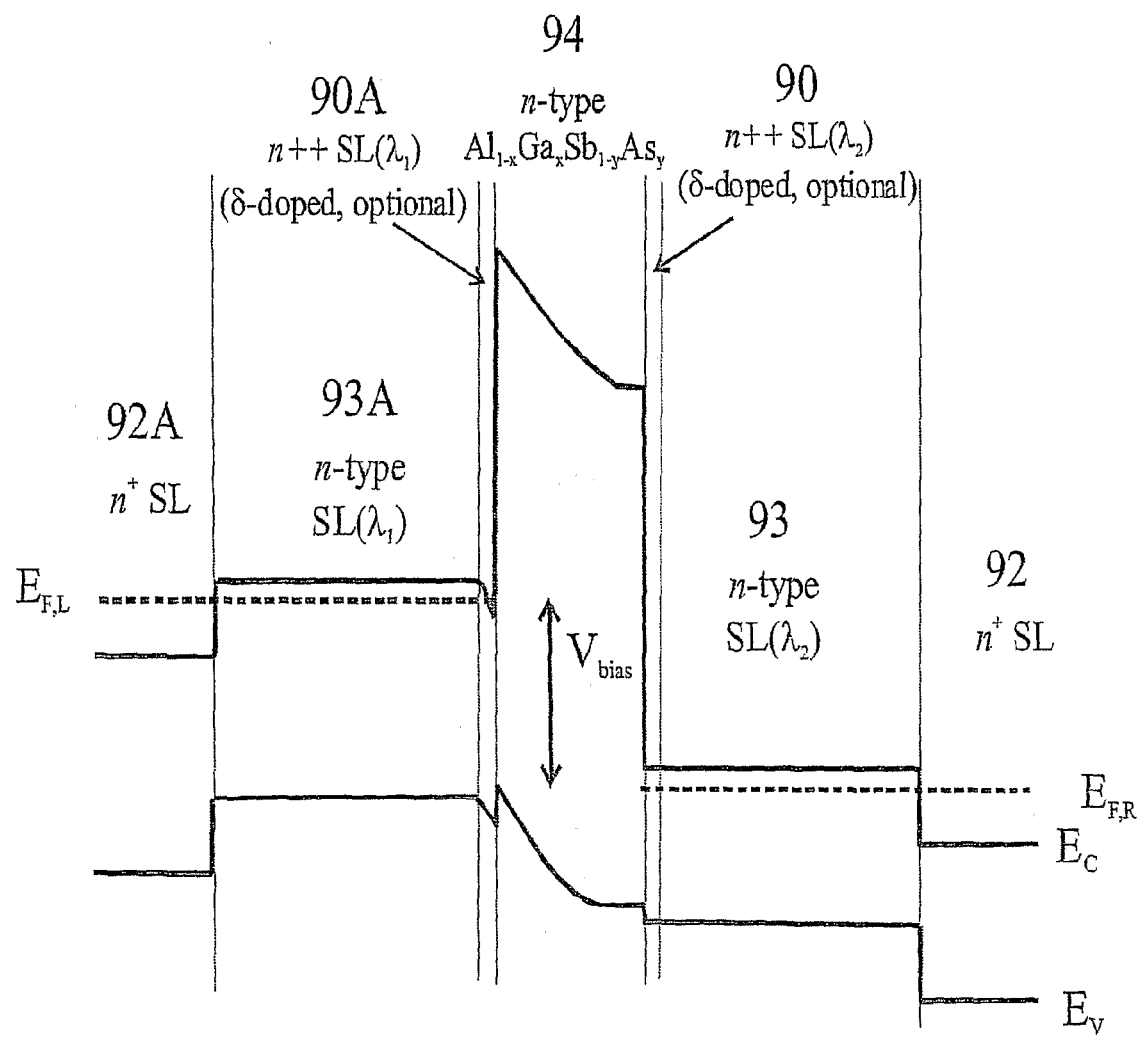
FIG. 7a shows the band diagram of a fourth embodiment of the hetero-junction photo-detector of the present invention, having two narrow bandgap layers each made from a type II superlattice with a different cut-off wavelength, and which is biased such that the narrow bandgap layer with the more positive bias acts as the photon absorbing layer and the narrow bandgap layer with the more negative bias acts as the contact layer
Figure 7B:
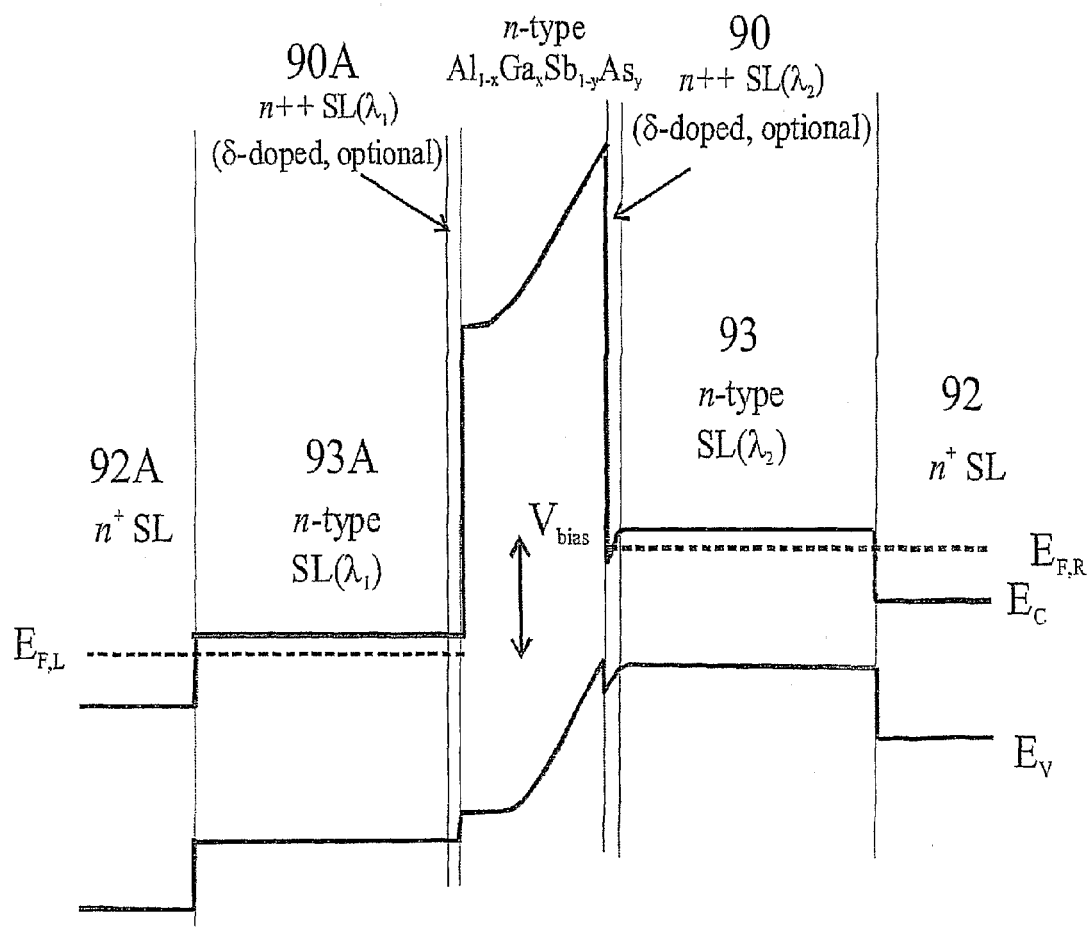
FIG. 7b shows the band diagram of the same fourth embodiment of the hetero-junction photo-detector of the present invention as that shown in FIG. 7a but in which the direction of the applied bias has been reversed.
Figure 7C:
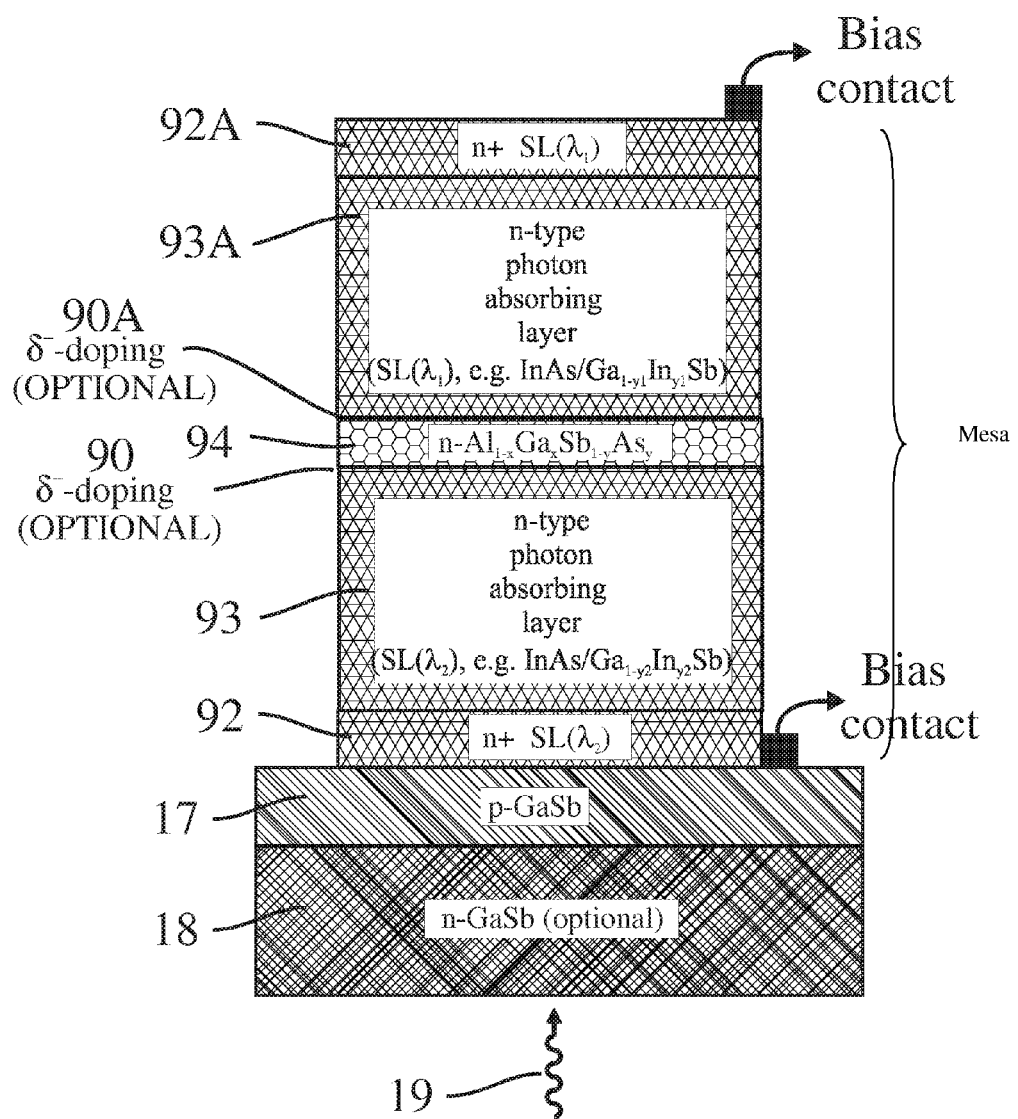
FIG. 7c illustrates in a schematic cross-section form, a possible structural arrangement of a fourth embodiment of the hetero-junction photo-detector of the present invention, having two narrow bandgap layers each made from a type II superlattice with a different cut-off wavelength, and which is biased such that the narrow bandgap layer with the more positive bias acts as the photon absorbing layer and the narrow bandgap layer with the more negative bias acts as the contact layer

A band diagram of a fourth embodiment of the invention is shown in FIGS. 7a and 7b. An example of the structure of the fourth embodiment is shown in FIG. 7c. In FIG. 7b the applied bias is the reverse of that in FIG. 7a. The two narrow bandgap layers 93 and 93A on either side of the barrier layer 94 have different bandgaps, corresponding to cut-off wavelengths $\lambda_2$ and $\lambda_1$ respectively, such that $\lambda_2 > \lambda_1$. The device is usually exposed to light that arrives first at layer 92A. Ideally the layer 93A with cut-off wavelength $\lambda_1$ is sufficiently thick to absorb most of the light with wavelengths less than $\lambda_1$. The light that passes through this layer and that is then absorbed in the layer 93 with cut-off wavelength $\lambda_2$ is then mostly in the range between $\lambda_2$ and $\lambda_1$.

When layers 92A and 93A are biased negative with respect to layers 92 and 93 as in FIG. 7a, layer 93 adopts the role of the photon absorbing layer and the signal is due to photons which mostly lie in the wavelength range between $\lambda_2$ and $\lambda_1$. When the bias is reversed as in FIG. 7b, layer 93A adopts the role of the photon absorbing layer and the signal is then due to photons which all lie in the wavelength range below $\lambda_1$.

The n-type layers 93 and 93A are both made from type II superlattice materials that comprise alternating sub-layers of InAs and Ga$_{1-x}$In$_x$Sb (or alternating sub-layers of closely related semiconductor alloys, e.g. InAs$_{1-w}$Sb$_w$, Ga$_{1-x-y}$In$_x$Al$_y$Sb$_{1-z}$As$_z$, etc. with $0 \leq w \leq 1$, $0 \leq x \leq 1$, $0 \leq y \leq 1$, $0 \leq z \leq 1$ and $x+y<1$) and wherein the sub-layers each have a thickness typically in the range of 0.6-10 nm. The thicknesses of the sub-layers and/or their precise alloy compositions are chosen differently for each of the two layers 93 and 93A to achieve the correct cut-off wavelengths $\lambda_2$ and $\lambda_1$ respectively. The average doping over many sub-layers of the superlattice materials that make up layers 93 and 93A is typically in the range, $n < 2\times10^{16}$ cm$^{-3}$ and the thicknesses of each of these superlattice regions are typically in the range 1-10 µm.

The use of a type II InAs/InGaSb (or closely related) superlattice material enables operation in both the Mid-Wave Infra-Red (MWIR: 3-5 µm) and in the Long-Wave Infra-Red (LWIR: 8-12 µm) terrestrial atmospheric transmission windows, and also in the Very Long-Wave Infra-Red (VLWIR: 12-20 µm) range.

The barrier layer 94 is made of GaAlSbAs alloy with typical thickness values in the range 0.05-1 µm.

The barrier layer 94 is n-type with a typical doping range of $1\times10^{15} \leq n < 1\times10^{17}$ cm$^{-3}$.

Layers of n-type δ-doping 90, 90A each having a typical doping of $5\times10^{10} < n < 10^{13}$ cm$^{-2}$, may be included next to the barrier layer 94 on each side as an option.

As shown in FIGS. 7a and 7b, a depletion region exists in the n-type barrier layer 94 and an accumulation layer of electrons usually exists in the negatively biased narrow bandgap layer next to the barrier layer 94 (280 and 210A respectively in general FIG. 3a). At maximum bias (shown in FIG. 7a), the bands in the positively biased narrow bandgap layer 93 are flat everywhere, while at lower bias an accumulation layer (210 in general FIG. 3a) occurs in the positively biased layer 93 next to the barrier layer 94.

Although the valence band offsets ($\Delta_1$ and $\Delta_2$ in general FIG. 3a) between the barrier layer 94 and the layers that surround it 93, 93A are shown positive in FIG. 7a, they may be made negative up to a most negative value of about $-10kT_{op}$ by changing the amount of aluminum and arsenic in the barrier layer 94. Ideally the magnitude of said offsets should be made to be as small as possible.

Embodiment 5

Figure 8A:
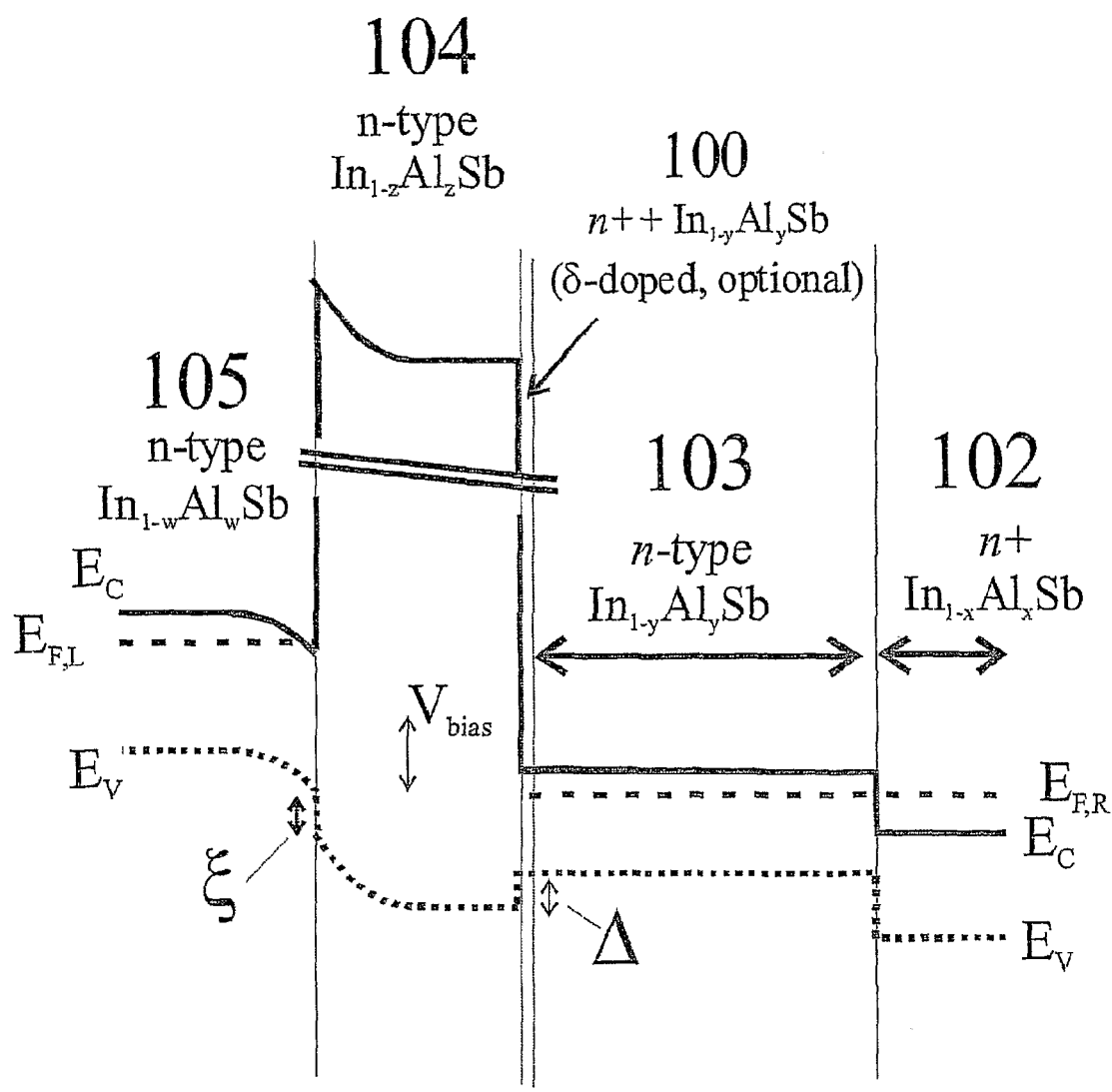
FIG. 8a shows the band diagram of a fifth embodiment of the hetero-junction photo-detector of the present invention, having an InAlSb photon absorbing layer which is biased positive with respect to an InAlSb contact layer.
Figure 8B:
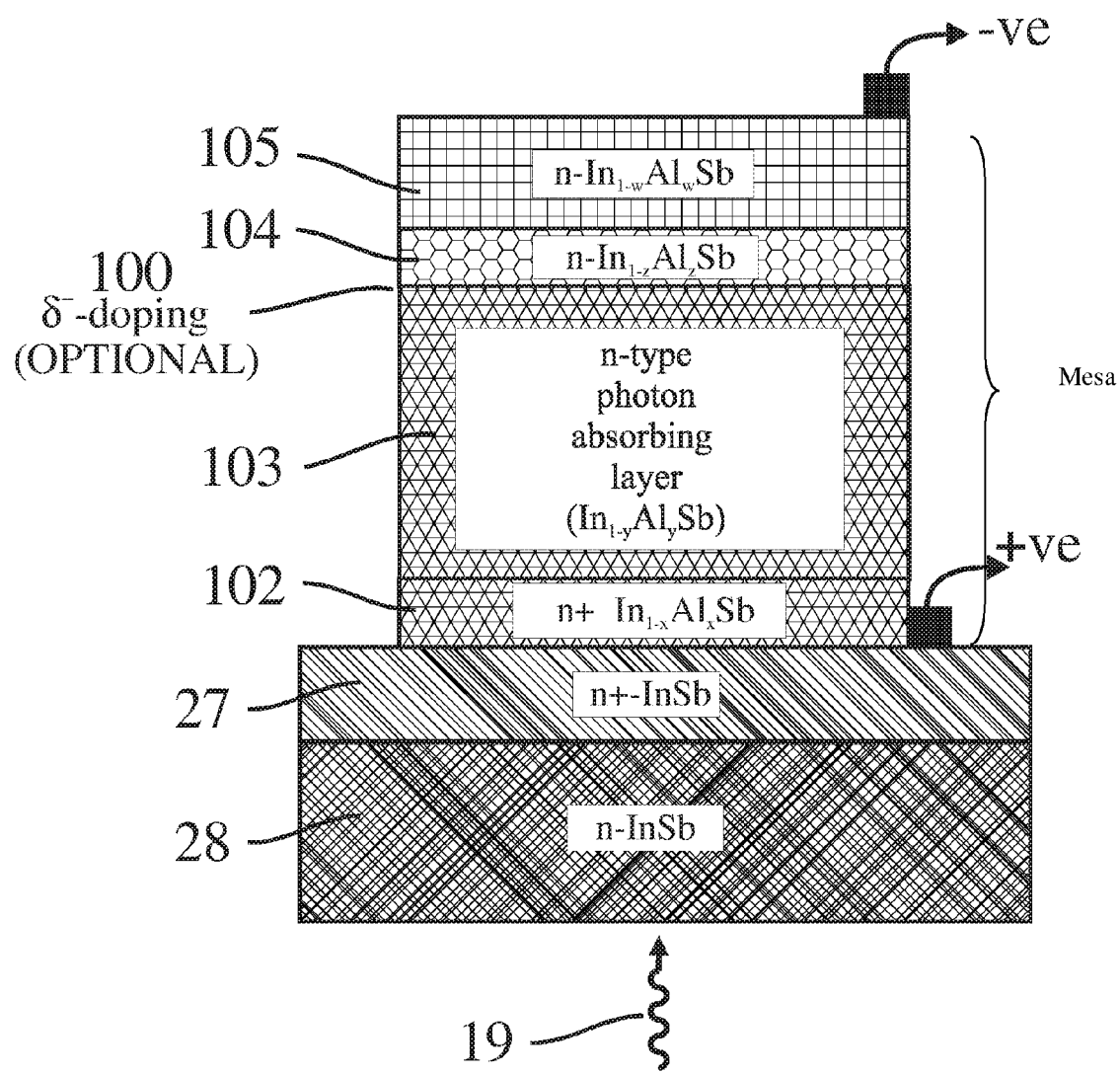
FIG. 8b illustrates in a schematic cross-section form, a possible structural arrangement of a fifth embodiment of the hetero-junction photo-detector of the present invention, having an InAlSb photon absorbing layer which is biased positive with respect to an InAlSb contact layer.

A band diagram of a fifth embodiment of the invention is shown in FIG. 8a. An example of the structure of said fifth embodiment is shown in FIG. 8b. In the fifth embodiment, band bending is allowed in the barrier layer 104 and a short distance into the contact layer 105. Band bending in the contact layer 105 is usually due to electron accumulation close to the barrier layer (like 210A in general FIG. 3a). At maximum bias (shown in FIG. 8a), the bands in the photon absorbing layer 103 are flat while at lower bias an accumulation layer (like 210 in general FIG. 3a) occurs in the photon absorbing layer 103 next to the barrier layer 104.

The n-type photon-absorbing layer 103 is made of InSb or InAlSb alloy. The doping is typically in the range of $n < 2\times10^{16}$ cm$^{-3}$ and the thickness is typically in the range 1-10 µm.

The use of InAlSb enables operation in the MWIR atmospheric transmission window (3-5 µm).

The contact layer 105 is made of n-type InSb or InAlSb with typical values of doping in the range $5\times10^{14} < n < 5\times10^{16}$ cm$^{-3}$ and thickness >0.1 µm.

The barrier layer 104 is made of InAlSb alloy, with thickness typically in the range of 0.05-1 µm.

The barrier layer 104 is n-type with a typical doping range of $1\times10^{15} \leq n < 1\times10^{17}$ cm$^{-3}$.

An n-type δ-doping layer 100, having a typical doping of $5\times10^{10} < n < 10^{13}$ cm$^{-2}$, may be included between the photon absorbing layer 103 and the barrier layer 104, as an option.

Further Embodiments

In all embodiments, it is advantageous to join the boundary of the photon-absorbing layer 53, 23, 83, 93, 93A or 103 furthest from the barrier layer 54, 24, 74, 84, 94, 104 to a material of nearly the same composition as the photon absorbing layer material but with much higher n-doping 22, 82, 92, 92A, 102 (typical values: $n < 3\times10^{18}$ cm$^{-3}$), so that the valence band of the highly doped layer lies below the valence band of the photon absorbing layer by significantly more than $3kT_{op}$. This can improve efficiency and electrical contact quality. However, it should be noted that these highly doped layers are optional. The high doping can be chosen to make the InAsSb, InAlSb or Type II Superlattice layer nearly transparent to MWIR radiation by exploiting the Moss Burstein effect, as reported by T Ashley et al., in "Large Format MWIR Focal Plane Arrays", in SPIE proceedings vol. 4820, page 400. This ensures efficient coupling of the incident infrared radiation to the photon absorbing layer.

Embodiment 3 has a photon-absorbing layer 83 and a contact layer 85 based on a type II superlattice material, and is closely analogous to embodiment 1, which has a photon-absorbing layer 23 and a contact layer 75 based on InAsSb alloy. Both of these embodiments 1 and 3 have an n-type $Al_{1-x}Ga_xSb_{1-y}As_y$ barrier layer 24, 84 (but usually with different composition values, x and y, in each case). It is clear that other variations can be devised with a photon-absorbing layer based on a type II superlattice material, which have a p-type $Al_{1-x}Ga_xSb_{1-y}As_y$ barrier layer, analogous to embodiment 2. Similarly embodiment 4 could be made with a p-type $Al_{1-x}Ga_xSb_{1-y}As_y$ barrier layer and suitable n-type δ-doping layers on both sides of the barrier. In embodiment 4 the two narrow bandgap regions 92, 93 and 92A, 93A could also be made from InAsSb alloys instead of from type II superlattices, analogous to embodiment 1.

In embodiments 1 and 2, the n-type contact layer 75 could be made in each case from n-type GaSb which is also a material with suitable band offsets and a close lattice match.

The following Table 1 provides some approximate band offset ranges for materials when grown on GaSb substrates:

TABLE 1

| Material 1 | Material 2 | Approx. Valence band offset (meV), Δ $\Delta = E_v(1) - E_v(2)$ | |
|---|---|---|---|
| | | Min. | Max. |
| AlSb | $InAs_{0.91}Sb_{0.09}$ | 30 | 200 |
| GaSb | $InAs_{0.91}Sb_{0.09}$ | 390 | 560 |
| GaSb | InAs/InGaSb superlattice | 30 | 100 |

Table 2 provides approximate bandgaps and cut-off wavelengths of Semiconducting materials at 77K that can be grown on GaSb substrates:

TABLE 2

| Material | Composition range (x) | Approx. Bandgap (meV) | Approx. Cut-off wavelength (μm) |
|---|---|---|---|
| GaSb | — | 800 | 1.55 |
| $Ga_{0.5}Al_{0.5}Sb$ | — | 1560 | 0.80 |
| AlSb | — | 1660 | (indirect gap) |
| $Ga_{1-x}Al_xSb$ | 0-1 | 800-1660 | 1.55-0.74 |
| $InAs_{0.91}Sb_{0.09}$ | — | 310 | 4.0 |
| $InAs_{1-x}Sb_x$ | 0-0.2 | 410-260 | 3.0-4.8 |
| InAs/InGaSb superlattice | — | 60-400 | 3-20 |

The following Table 3 provides approximate band offset range information for materials when grown on InSb substrates:

TABLE 3

| Material 1 | Material 2 | Approx. Valence band offset (including strain effects) (meV), Δ $\Delta = E_v(1) - E_v(2)$ | |
|---|---|---|---|
| | | Min | Max |
| InSb | $In_{0.9}Al_{0.1}Sb$ | 20 | 40 |

Table 4 provides approximate bandgap and cut-off wavelength information of Semiconducting material at 77K that can be grown on InSb substrates:

TABLE 4

| Material | Composition range (x) | Approx. Bandgap (including strain effects) (meV) | Approx. Cut-off wavelength (including strain effects) (μm) |
|---|---|---|---|
| $In_{1-x}Al_xSb$ | 0-0.3 | 225-565 | 5.5-2.2 |

With reference to FIGS. 4b, 4c, 5b, 6b, 7c, and 8b the semiconductor layers are usually grown by modern semiconductor epitaxy methods such as Liquid Phase Epitaxy (LPE), Molecular Beam Epitaxy (MBE), Metal-Organic Vapour Phase Epitaxy (MOVPE), or any of their derivatives, onto a semiconductor substrate (17, 18, or 28) [e.g. see "Growth and Characterization of Semiconductors", edited by R A Stradling and P C Klipstein, published by Adam Hilger (1990), ISBN 0-85274-131-6]. For embodiments 1-4, a good choice of substrate is GaSb doped either p-type 17 (e.g. p ~1-100× $10^{16}$ cm$^{-3}$) or n-type 18 (e.g. n ~1-100×$10^{16}$ cm$^{-3}$). An n-type GaSb substrate 18 is usually preferred for MWIR applications due to its lower free carrier absorption of the IR radiation. In this case a p-type GaSb buffer layer 17, which conveniently forms an Ohmic contact with n-type InAsSb [e.g. see P C Klipstein et al, in Semiconductor Hetero-Epitaxy, published by World Scientific, Singapore, page 515, ISBN 981 02 2479 6], may be grown on top of the n-type GaSb substrate. GaSb is closely lattice matched to the materials used for the other layers. Other choices of substrate 18 include InAs, GaAs, Si, Ge, and compliant substrates, although in some cases the lattice matching is less good than for GaSb.

For embodiment 5, a good choice of substrate is InSb doped n-type 28 (e.g. n ~1-300×$10^{16}$ cm$^{-3}$). Other choices of substrate 28 include InAs, GaAs, Si, Ge, and compliant substrates, although in some cases the lattice matching is less good than for InSb.

After growth, the wafer is etched into a mesa structure, after which the sides are passivated with a suitable chemical treatment and/or with the application of a suitable insulating or dielectric layer (for example, silicon nitride) and electrical contacts are then applied. The depth of the mesa can vary but it should be etched at least up to the beginning of the barrier layer (like FIG. 4c appropriate to embodiment 1) to provide suitable isolation between the mesa and other devices. Schematic arrangements with deeper mesas are depicted in FIGS. 4b, 5b, 6b 7c and 8b, where the mesa is shown etched to a depth beyond the photon absorbing layer. The choice of passivation treatment may depend on the chosen mesa depth, according to the type and area of the surfaces exposed by the etch treatment. The substrate is usually thinned to allow light 19 to pass without significant losses due to free carrier absorption, and also to avoid possible cracking or other stress related problems at low temperatures.

It is a common practice, when producing focal plane array detectors, to make the top contact with an Indium Bump and to connect it to a pixel on a Silicon Read-Out Integrated Circuit (Si-ROIC). Note that in all embodiments of the structures shown in FIGS. 4b, 4c, 5b, 6b, and 8b the contact layer is grown after the photon absorbing layer of the device and forms the top part of the mesa. The device is then designed to operate with the top of the mesa biased negative. The opposite polarity can be achieved by growing the structure appropriately so that the photon absorbing layer is grown after the contact layer, although in that case the contact layer should be as thin as possible to minimize the amount of light which it absorbs.

It is possible also to produce a focal plane array in which each pixel is made up out of several detector sub-units with each sub-unit containing a structure as described in embodiments 1, 2, 3, or 5. The sub-units are stacked on top of each other (separated with a highly doped layer, which provides a suitable common contact between sub-units and prevents minority carriers transferring between sub-units) with a separate indium bump made to each sub-unit. Each sub-unit may be designed to have a different cut-off wavelength so that the detector is sensitive to more than one wavelength band. If two sub-units are used, they may also have the same cut-off wavelength if a skimming arrangement is implemented to offset the dark current.

It is also possible to produce a focal plane array as described in the previous paragraph in which each sub-unit contains a structure as described in embodiment 4. In this case each sub-unit will be sensitive to two wavelength bands according to the direction of the bias applied to that sub-unit. A stack of two subunits could then in principle be sensitive to 4 different wavelength bands, with the simultaneous registration of up to two bands out of these four at any one time.

It should be noted that the suppression of the dark current (or noise) in the photo-detector, as achieved by the present invention reduces the Johnson and Schott noise in the detector at a given operating temperature, to a level significantly below the level of that which exists in a homo-junction p-n diode detector made from the same photon absorbing material. An important consequence of the noise reduction is allowing the operating temperature of the photo-detector, $T_{op}$, to be raised in comparison with that of a homo-junction detector made from the same photon absorbing material and operating with the same level of Johnson or Schott noise.

While some embodiments of the invention have been described by way of illustration, it will be apparent that the invention can be carried into practice with many modifications, variations and adaptations, and with the use of numerous equivalents or alternative solutions that are within the scope of persons skilled in the art, without departing from the spirit of the invention or exceeding the scope of the claims.

The invention claimed is:

1. A photo-detector comprising a semiconductor heterostructure comprising a first heterojunction, formed by a first n-type layer of a certain energy bandgap and a doped middle barrier layer, and a second heterojunction, formed by said middle barrier layer and, a second n-type layer, the layer materials being selected such that the energy bandgaps of the first and second n-type layers are narrower than that of said middle barrier layer, wherein when biased with an externally applied voltage, the more negatively biased narrow bandgap layer is a contact layer and the more positively biased narrow bandgap layer is a photon absorbing layer, the first and second heterojunctions being thus configured and operable to prevent creation of a depletion region in said photon absorbing layer when a bias voltage is applied across the heterostructure such that a tunnel current of electrons from the contact layer to the photon absorbing layer is less than a dark current in the photo-detector and the dark current from the photon-absorbing layer to said middle barrier layer is essentially diffusion limited, thus reducing generation recombination (GR) noise of the photo-detector.

2. A photo-detector according to claim 1 wherein each of the narrow bandgap layers has a thickness of 0.1-10 µm with doping in the range $5 \times 10^{14}$ cm$^{-3}$ < n < $5 \times 10^{16}$ cm$^{-3}$.

3. A photo-detector according to claim 1 wherein said middle barrier layer has a thickness of between 0.05 and 1 µm.

4. A photo-detector according to claim 1 wherein said middle barrier layer is n-type and is doped in the range n < $1 \times 10^{17}$ cm$^{-3}$.

5. A photo-detector according to claim 1, wherein the narrow bandgap layers are made from InSb or InAl$_x$Sb$_{1-x}$ alloy.

6. A photo-detector according to claim 1 wherein the middle barrier layer is an InAl$_x$Sb$_{1-x}$ alloy.

7. A photo-detector according to claim 1, wherein at least one of the narrow bandgap layers is made from an InAl$_{1-x}$Sb$_x$ alloy.

8. A photo-detector according to claim 1 wherein the contact layer is GaSb.

9. A photo-detector according to claim 1 wherein at least one of the narrow bandgap layers is made from type II superlattice material which comprises alternating sub-layers of InAs$_{1-w}$Sb$_w$ and Ga$_{1-x-y}$In$_x$Al$_y$Sb$_{1-z}$As$_z$ with $0 \leq w \leq 1$, $0 \leq x \leq 1$, $0 \leq y \leq 1$, $0 \leq z \leq 1$ and x+y<1 and wherein the sub-layers each have a thickness in the range of 0.6-10 nm.

10. A photo-detector according to claim 1 wherein said middle barrier layer is a Ga$_{1-x}$Al$_x$Sb$_{1-y}$As$_y$ alloy with $0 \leq x \leq 1$ and $0 \leq y \leq 1$.

11. A photo-detector according to claim 1 wherein the middle barrier layer is an In$_{1-x}$Al$_x$Sb$_{1-y}$As$_y$ alloy with $0 \leq x \leq 1$ and $0 \leq y \leq 1$.

12. An array of detectors in which each detector is in accordance with claim 1 and which is connected to a silicon readout circuit by an indium bump.

13. A photo-detector according to claim 1 wherein the middle barrier layer is doped p-type with p < $1 \times 10^{17}$ cm$^{-3}$ and wherein one or both of the n-type narrow bandgap layers is terminated next to the barrier layer by an n-type δ-doping layer with $5 \times 10^{10}$ < n < $10^{13}$ donors cm$^{-2}$ so that a p-n junction is formed between said barrier layer and each n-type δ-doping layer.

14. A photo-detector according to claim 1 in which one or both of the n type narrow bandgap layers is terminated at the side furthest from the middle barrier layer by a highly n-doped terminating layer, typically with $3 \times 10^{17}$ < n < $3 \times 10^{18}$ donors cm$^{-3}$, and with typical thickness 0.05-4 µm, so that the valence band edge of said highly n-doped terminating layer lies below that of the adjacent n-type narrow bandgap layer.

15. An array of detectors in which each detector is in accordance with claim 14 and which is connected to a silicon readout circuit by an indium bump.

16. A photo-detector comprising stacked detector sub-units wherein each subunit is as in claim 14 wherein both of the n-type narrow bandgap layers in each of said sub-units is terminated by a highly n-doped terminating layer, and wherein an external contact is made to each of the resulting highly n-doped regions.

17. A photo-detector as in claim 16 wherein the narrow bandgap layers of at least one sub-unit are made from $InAs_{1-x}Sb_x$ alloys.

18. A photo-detector as in claim 16 wherein the narrow bandgap layers of at least one sub-unit are made from type II superlattice materials which comprise alternating sub-layers of $InAs_{1-w}Sb_w$ and $Ga_{1-x-y}In_xAl_ySb_{1-z}As_z$ with $0 \leq w \leq 1$, $0 \leq x \leq 1$, $0 \leq y \leq 1$, $0 \leq z \leq 1$ and $x+y<1$ and wherein the sub-layers each have a thickness in the range of 0.6-10 nm.

19. A photo-detector as in claim 16 wherein the narrow bandgap layers of the subunits are made from InSb or from $In_{1-x}Al_xSb$ alloys.

20. An array of detectors in accordance with claim 16 in which each detector is sensitive to one or more wavelength band, and in which each detector is connected to a silicon readout circuit using one indium bump per detector sub-unit.

21. A photo-detector according to claim 1, wherein one or more mesa structures are etched through the uppermost layer to a depth suitable for electrical isolation.

22. A photo-detector according to claim 21 in which the surfaces of each mesa structure exposed by the etch treatment undergo a chemical treatment after which a dielectric layer is applied, and wherein said dielectric layer has openings to allow the application of metal contacts.

23. A photo-detector according to claim 21 to which a dielectric layer is applied to the surfaces of each mesa structure exposed by the etch treatment, and wherein said dielectric layer has openings to allow the application of metal contacts.

24. A photo-detector comprising a semiconductor heterostructure comprising a first heterojunction, formed by a first p-type layer of a certain energy bandgap and a doped middle barrier layer, and a second heterojunction, formed by said middle barrier layer and a second p-type layer, the layer materials being selected such that the energy bandgaps of the first and second p-type layers are narrower than that of said middle barrier layer, wherein when biased with an externally applied voltage, the more positively biased narrow bandgap layer is a contact layer and the more negatively biased narrow bandgap layer is a photon absorbing layer, the first and second heterojunctions being thus configured and operable to prevent creation of a depletion region in said photon absorbing layer when a bias voltage is applied across the heterostructure such that a tunnel current of holes from the contact layer to the photon absorbing layer is less than a dark current in the photo-detector and the dark current from the photon-absorbing layer to said middle barrier layer is essentially diffusion limited, thus reducing generation recombination (GR) noise of the photo-detector.

25. A photo-detector according to claim 24 wherein each of the narrow bandgap layers has a thickness of 0.1-10 μm with doping in the range $p<1\times10^{18}$ cm$^{-3}$.

26. A photo-detector according to claim 24 wherein said middle barrier layer is doped with $p<1\times10^{17}$ acceptors cm$^{-3}$.

27. An array of detectors in which each detector is in accordance with claim 24 and which is connected to a silicon readout circuit by an indium bump.

28. A photo-detector according to claim 24 wherein the middle barrier layer is doped n-type with $n<1\times10^{17}$ cm$^{-3}$ and wherein one or both of the p-type narrow bandgap layers is terminated next to the barrier layer by a p-type δ-doping layer with $5\times10^{10}<p<10^{13}$ acceptors cm$^{-2}$ so that a p-n junction is formed between said barrier layer and each p-type-doping layer.

29. A photo-detector according to claim 24 in which one or both of the p-type narrow bandgap layers is terminated at the side furthest from the middle barrier layer by a highly p-doped terminating layer, typically with $3\times10^{17}<p<3\times10^{20}$ acceptors cm$^{-3}$, and with thickness typically 0.05-4 μm, so that the conduction band edge of said highly p-doped terminating layer lies above that of the adjacent p-type narrow bandgap layer.

30. A photo-detector comprising stacked detector sub-units as in claim 29, wherein both of the p-type narrow bandgap layers in each of said sub-units is terminated by a highly p-doped terminating layer, and wherein an external contact is made to each of the resulting highly p-doped regions.

31. An array of detectors in accordance with claim 30 in which each detector is sensitive to one or more wavelength band, and in which each detector is connected to a silicon readout circuit using one indium bump per detector sub-unit.

32. An array of detectors in which each detector is in accordance with claim 29 and which is connected to a silicon readout circuit by an indium bump.

33. A photo-detector according to claim 24, wherein one or more mesa structures are etched through the uppermost layer to a depth suitable for electrical isolation.

34. A photo-detector according to claim 33 in which the surfaces of each mesa structure exposed by the etch treatment undergo a chemical treatment after which a dielectric layer is applied, and wherein said dielectric layer has openings to allow the application of metal contacts.

35. A photo-detector according to claim 33 to which a dielectric layer is applied to the surfaces of each mesa structure exposed by the etch treatment, and wherein said dielectric layer has openings to allow the application of metal contacts.

* * * * *